US012660666B2

(12) United States Patent
Kim et al.

(10) Patent No.: US 12,660,666 B2
(45) Date of Patent: Jun. 16, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Cheol Kim, Suwon-si (KR); Hwanyoung Choi, Suwon-si (KR); Seokhyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 442 days.

(21) Appl. No.: 18/367,896

(22) Filed: Sep. 13, 2023

(65) Prior Publication Data

US 2024/0120263 A1 Apr. 11, 2024

(30) Foreign Application Priority Data

Oct. 11, 2022 (KR) ........................ 10-2022-0129454

(51) Int. Cl.
*H01L 23/498* (2006.01)
*H01L 23/00* (2006.01)
(Continued)

(52) U.S. Cl.
CPC .... *H01L 23/49822* (2013.01); *H01L 23/3142* (2013.01); *H01L 23/3672* (2013.01);
(Continued)

(58) Field of Classification Search
CPC .......... H01L 23/49822; H01L 23/3142; H01L 23/373; H01L 25/0652; H01L 2225/06589; H01L 21/486
(Continued)

(56) References Cited

U.S. PATENT DOCUMENTS 6,225,695 B1 5/2001 Chia et al.
7,361,972 B2 4/2008 Chen
(Continued)

FOREIGN PATENT DOCUMENTS

JP H06-283874 A 10/1994
KR 10-2021-0150658 A 12/2021
KR 10-2022-0078131 A 6/2022

OTHER PUBLICATIONS

Office Action in Korean Appln. No. 10-2022-0129454, mailed on Feb. 28, 2026, 16 pages (with English translation).

*Primary Examiner* — Quoc D Hoang
(74) *Attorney, Agent, or Firm* — Fish & Richardson P.C.

(57) ABSTRACT

A semiconductor package includes a package substrate, an interposer mounted on the package substrate via first conductive bumps; first and second semiconductor devices on the interposer and spaced apart from each other, mounted on the interposer via second conductive bumps and having concavo-convex patterns respectively formed in upper surfaces thereof; and a sealing member on the interposer covering the first and second semiconductor devices and exposing the concavo-convex patterns. The concavo-convex pattern of the first semiconductor device includes a plurality of first pillar structures provided in the upper surface of a first region of the first semiconductor device and having a first width, and a plurality of second pillar structures provided in the upper surface of a second region of the first semiconductor device and having a second width greater than the first width.

20 Claims, 24 Drawing Sheets

13

(51) Int. Cl.
    *H01L 23/31*      (2006.01)
    *H01L 23/367*    (2006.01)
    *H01L 23/373*    (2006.01)
    *H01L 25/065*    (2023.01)

(52) U.S. Cl.
    CPC ...... *H01L 23/373* (2013.01); *H01L 23/49816*
         (2013.01); *H01L 24/08* (2013.01); *H01L*
      *25/0655* (2013.01); *H01L 2224/081* (2013.01);
        *H01L 2924/1431* (2013.01); *H01L 2924/1436*
          (2013.01); *H01L 2924/1438* (2013.01)

(58) Field of Classification Search
    USPC ....................................................... 257/734
    See application file for complete search history.

(56)             References Cited

U.S. PATENT DOCUMENTS

| | | | |
|---|---|---|---|
| 7,523,617 | B2 | 4/2009 | Venkatasubramanian et al. |
| 8,004,841 | B2 | 8/2011 | Cipolla et al. |
| 8,907,461 | B1 | 12/2014 | Konchady et al. |
| 9,431,316 | B2 | 8/2016 | Pagaila |
| 10,215,500 | B2 | 2/2019 | Groothuis et al. |
| 11,302,603 | B2 | 4/2022 | Cola et al. |
| 11,387,164 | B2 | 7/2022 | Wu et al. |
| 2015/0279761 | A1* | 10/2015 | Bet-Shliemoun ....... H01L 23/36 |
| | | | 257/714 |
| 2018/0190562 | A1 | 7/2018 | Figuiere et al. |
| 2021/0375712 | A1 | 12/2021 | Patil et al. |

\* cited by examiner

SEMICONDUCTOR PACKAGE AND METHOD OF MANUFACTURING THE SEMICONDUCTOR PACKAGE

CROSS-REFERENCE TO RELATED APPLICATION(S)

A claim of priority under 35 U.S.C. § 119 is made to Korean Patent Application No. 10-2022-0129454, filed on Oct. 11, 2022 in the Korean Intellectual Property Office (KIPO), the entirety of which is hereby incorporated by reference.

BACKGROUND

The present disclosure relates to semiconductor packages and methods of manufacturing semiconductor packages. More particularly, the present disclosure relates to semiconductor packages including a plurality of different chips stacked on a package substrate using an interposer and methods of manufacturing the same.

An electronic device including a high bandwidth memory (HBM) or a stacked chip package may use a separate substrate such as a silicon interposer to provide high-density interconnection. In particular, in a molded interposer package in which a silicon interface is exposed, heat dissipation structures may be stacked together with a thermal interface material layer (TIM) on upper surfaces of semiconductor devices exposed by a molding member. However, heat generated in a hot spot region of a semiconductor device such as an integrated circuit chip may not be easily dissipated due to contact thermal resistance between the thermal interface material layer and interfaces of the heat dissipation structures, making it difficult to increase heat transfer efficiency.

SUMMARY

Embodiments of the inventive concepts provide a semiconductor package having an interposer capable of effectively dissipating local heat of a semiconductor device molded therein, and a method of manufacturing the semiconductor package.

Embodiments of the inventive concepts provide a semiconductor package including a package substrate; an interposer mounted on the package substrate via first conductive bumps; a first semiconductor device mounted on the interposer via second conductive bumps and including a first region and a second region; at least one second semiconductor device spaced apart from the first semiconductor device on the interposer and mounted on the interposer via third conductive bumps; a sealing member covering the first semiconductor device and the at least one second semiconductor device on the interposer and exposing upper surfaces of the first semiconductor device and the at least one second semiconductor device; a plurality of first pillar structures provided in an upper surface of the first region of the first semiconductor device and having a first width; a plurality of second pillar structures provided in an upper surface of the second region of the first semiconductor device, and having a second width greater than the first width; a plurality of third pillar structures provided in an upper surface of the at least one second semiconductor device; a reinforcing member extending on the package substrate to surround the interposer; a thermal interface material layer provided on the upper surfaces of the first semiconductor device and the at least one second semiconductor device, and a heat slug provided on the reinforcing member and the thermal interface material layer.

Embodiments of the inventive concepts further provide a semiconductor package including a package substrate; an interposer mounted on the package substrate via first conductive bumps; first and second semiconductor devices on the interposer and spaced apart from each other, mounted on the interposer via second conductive bumps and having concavo-convex patterns respectively formed in upper surfaces thereof; and a sealing member on the interposer covering the first and second semiconductor devices and exposing the concavo-convex patterns. The concavo-convex patterns include a first concavo-convex pattern covering the first semiconductor device. The first concavo-convex pattern includes a plurality of first pillar structures provided in an upper surface of a first region of the first semiconductor device and having a first width, and a plurality of second pillar structures provided in an upper surface of a second region of the first semiconductor device and having a second width greater than the first width.

Embodiments of the inventive concepts still further provide a semiconductor package including a package substrate; an interposer mounted on the package substrate via first conductive bumps; a first semiconductor device mounted on the interposer via second conductive bumps and including a first region and a second region; at least one second semiconductor device spaced apart from the first semiconductor device on the interposer and mounted via third conductive bumps; a sealing member on the interposer covering the first semiconductor device and the at least one second semiconductor device and exposing upper surfaces of the first semiconductor device and the at least one second semiconductor device; a plurality of first pillar structures provided in an upper surface of the first region of the first semiconductor device, the first pillar structures having a first width and a first spacing distance therebetween; a plurality of second pillar structures provided in an upper surface of the second region of the first semiconductor device, the second pillar structures having a second width greater than the first width and a second spacing distance therebetween greater than the first spacing distance; and a plurality of third pillar structures provided in the upper surface of the at least one second semiconductor device.

According to embodiments of the inventive concepts, a semiconductor package may include an interposer mounted on a package substrate via first conductive bumps, first and second semiconductor devices disposed on the interposer, a sealing member on the interposer exposing upper surfaces of the first and second semiconductor devices, and first and second concavo-convex patterns as heat dissipation pattern structures provided in the upper surfaces of the first and second semiconductor devices exposed by the sealing member.

The first semiconductor device may include a first region as a hot spot region having a first current density and a second region having a second current density lower than the first current density. The first concavo-convex pattern may include a plurality of first pillar structures provided in the upper surface of the first region of the first semiconductor device and a plurality of second pillar structures provided in the upper surface of the second region of the first semiconductor device.

In the molded interposer package, the plurality of first pillar structures may be formed in the hot spot region in the surface where a silicon interface of the first semiconductor device is exposed, to thereby provide a thermal silicon fin surface. Accordingly, heat of the hot spot may be effectively dissipated and heat transfer surface area may be maximized.

BRIEF DESCRIPTION OF THE DRAWINGS

The above and other aspects, features and advantages of the inventive concepts will be more clearly understood from the following detailed description taken in conjunction with the accompanying drawings.

FIG. 4 illustrates an enlarged plan view of portion 'C' in FIG. 2.

FIGS. 5, 6, 7, 8, 9, 10, 11, 12, 13, 14, 15, 16, 17, 18, 19, 20, 21 and 22 illustrate views descriptive of a method of manufacturing a semiconductor package in accordance with embodiments of the inventive concepts.

FIG. 25 illustrates a cross-sectional view of a semiconductor package in accordance with embodiments of the inventive concepts.

DETAILED DESCRIPTION

Figure 1:
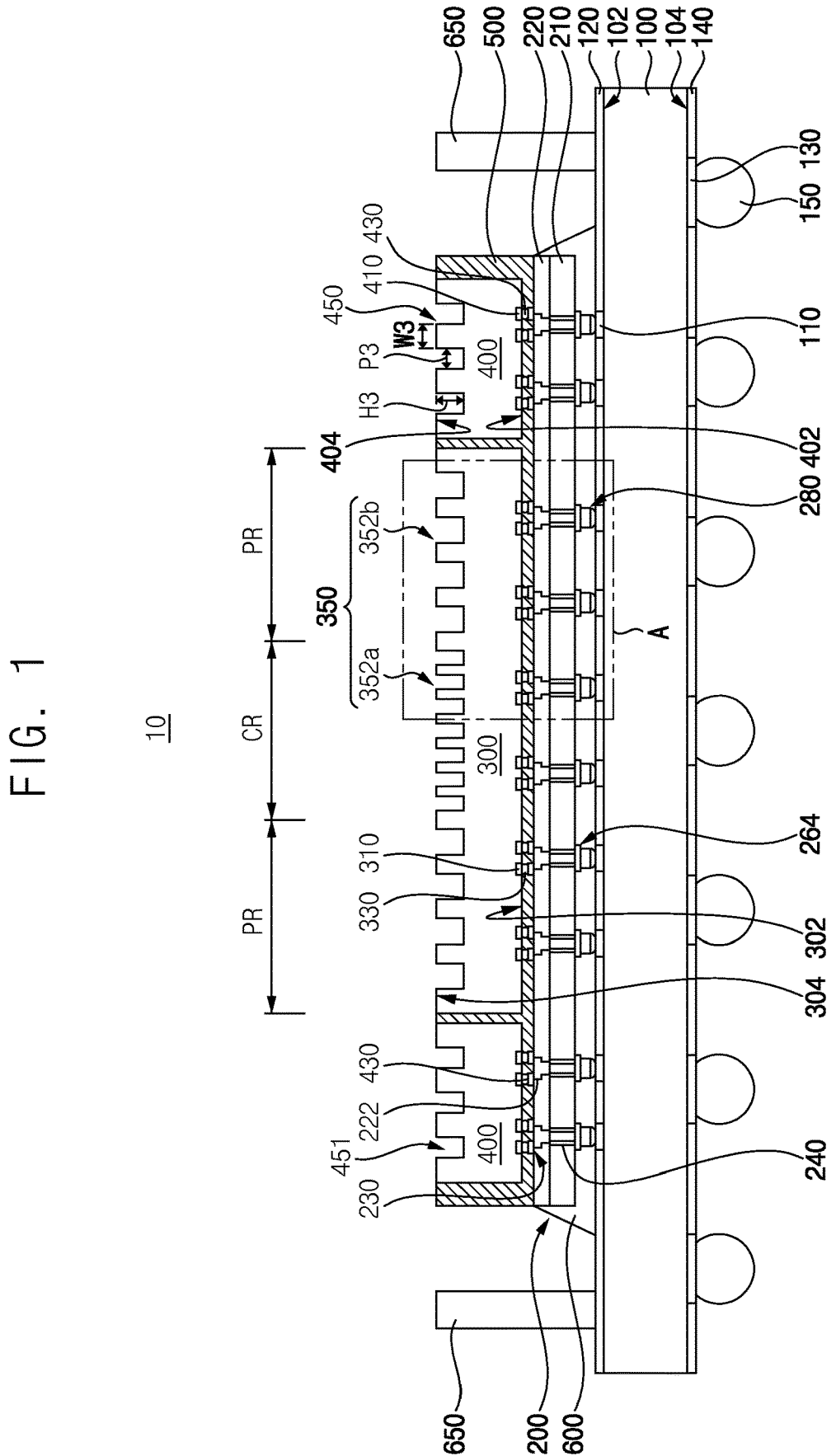
FIG. 1 illustrates a cross-sectional view of a semiconductor package in accordance with embodiments of the inventive concepts.

Hereinafter, example embodiments will be explained in detail with reference to the accompanying drawings. Throughout the description, relative locations of components may be described using such terms as for example "vertical", "horizontal", "over", "higher" and so on. These terms are for descriptive purposes only, and are intended only to describe the relative locations of components assuming the orientation of the overall device is the same as that shown in the drawings. The embodiments however should not be limited to the illustrated device orientations.

Figure 2:
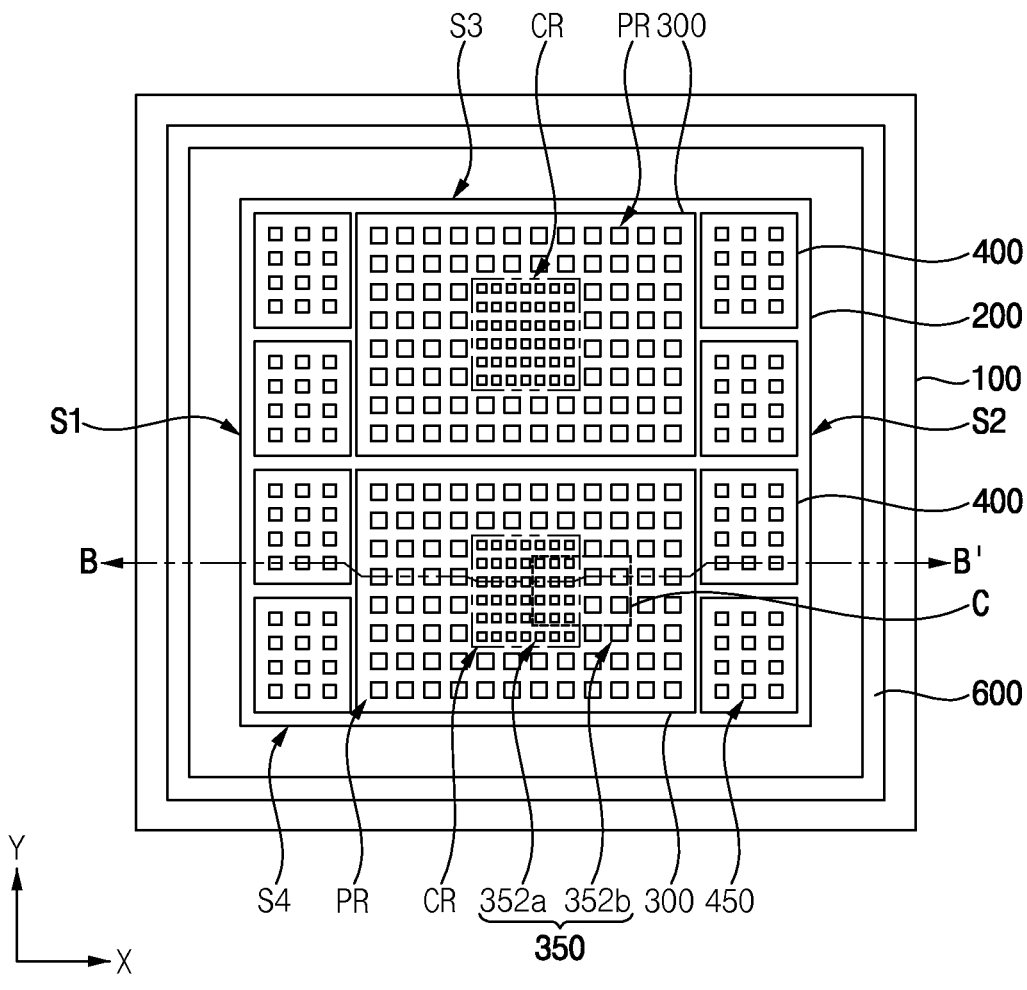
FIG. 2 illustrates a plan view of the semiconductor package in FIG. 1.
Figure 3:
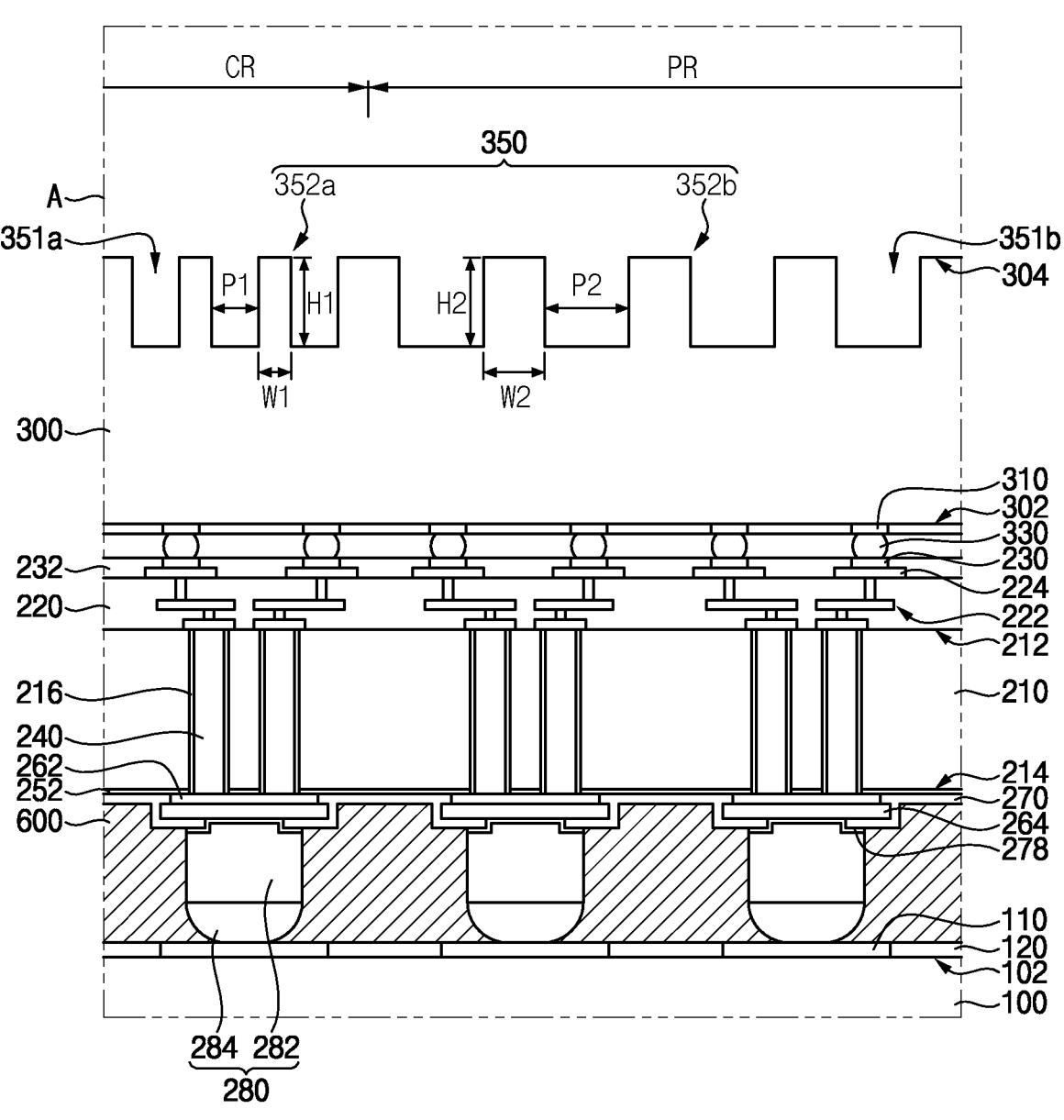
FIG. 3 illustrates is an enlarged cross-sectional view of portion 'A' in FIG. 1.
Figures 4, 5:
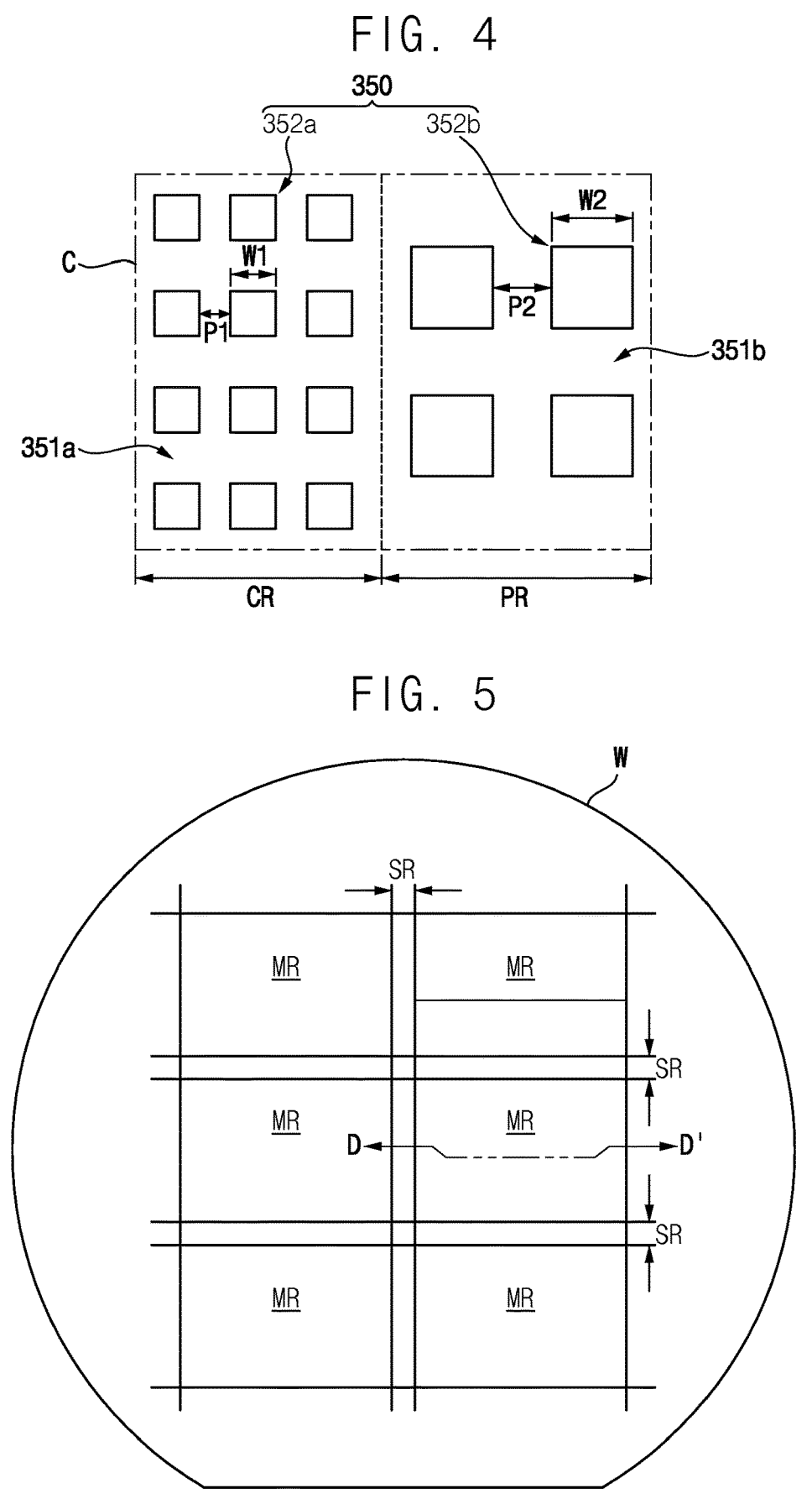

FIG. 1 illustrates a cross-sectional view of a semiconductor package in accordance with embodiments of the inventive concepts. FIG. 2 illustrates a plan view of the semiconductor package in FIG. 1. FIG. 3 illustrates an enlarged cross-sectional view of portion 'A' in FIG. 1. FIG. 4 illustrates an enlarged plan view of portion 'C' in FIG. 2. FIG. 1 illustrates a cross-sectional view taken along the line B-B' in FIG. 2. FIG. 2 illustrates a plan view of the semiconductor package in FIG. 1, wherein a sealing member on an interposer is omitted.

Referring to FIGS. 1 to 4, a semiconductor package 10 includes a package substrate 100, an interposer 200, first semiconductor devices 300, second semiconductor devices 400, a sealing member 500, and first and second concavo-convex patterns 350 and 450 as heat dissipation pattern structures. In addition, the semiconductor package 10 may further include an external connection member 150, an underfill member 600 and a reinforcing member 650.

In example embodiments, the semiconductor package 10 may be a memory device having a stacked chip structure in which a plurality of dies (chips) are stacked. For example, the semiconductor package 10 may include a semiconductor memory device having a 2.5 D chip structure. 2.5 D refers to a packaging methodology in which a plurality of dies (chips) are integrated into a single package by assembling at least some of them side-by-side on a shared base (e.g., an interposer). In this case, the first semiconductor devices 300 may include a logic semiconductor device, and the second semiconductor devices 400 may include a memory device. The logic semiconductor device may be an ASIC as a host such as a CPU, GPU, or SoC. The memory device may include a high bandwidth memory (HBM) device.

In example embodiments, the package substrate 100 may be a substrate having an upper surface 102 and a lower surface 104 opposite to each other. For example, the package substrate 100 may be a printed circuit board (PCB). The PCB may be a multi-layered circuit board having vias and various circuits therein, although not shown in FIG. 1.

The interposer 200 may be disposed on the package substrate 100. The interposer 200 may be mounted on the package substrate 100 via first conductive bumps 280. A planar area of the interposer 200 may be smaller than a planar area of the package substrate 100. When viewed in plan view, the interposer 200 may be disposed within the area of the package substrate 100.

As illustrated in FIG. 2, the interposer 200 may include a first side surface S1 and a second side surface S2 extending in a direction parallel with a first direction (Y direction) and which are opposite to each other. The first and second side surfaces S1 and S2 may extend in a direction perpendicular with respect to an upper planar surface of the interposer 200. The interposer 200 may further include a third side surface S3 and a fourth side surface S4 extending in a direction parallel with a second direction (X direction) which is perpendicular to the first direction and which are opposite to each other. The interposer 200 may have a rectangular shape. For example, the interposer 200 may have an area of 5 mm×6 mm or more. A length of one side of the interposer 200 may be within a range of 5 mm to 90 mm.

The two first semiconductor devices 300 may be arranged in a middle region of the interposer 200. The two first semiconductor devices 300 may be spaced apart from each other along the first direction (Y direction). The second semiconductor devices 400 may be arranged adjacent to each other at both sides of the first semiconductor devices 300. Two second semiconductor devices 400 may be arranged along the first side surface S1 at a first side of a first semiconductor device 300 and may be spaced apart from each other, and two second semiconductor devices 400 may be arranged along the second side surface S2 at a second side of a first semiconductor device 300 opposite to the first side and may be spaced apart from each other.

The interposer 200 may be a silicon interposer or a redistribution interposer having a plurality of wirings therein. The first semiconductor devices 300 and the second semiconductor devices 400 may be connected to each other through the wirings inside the interposer 200 or electrically connected to the package substrate 100 through the first conductive bumps 280. The interposer 200 may provide a high density interconnection between the first and second semiconductor devices 300 and 400.

As illustrated in FIG. 3, the interposer 200 may include a substrate 210, a wiring layer 220 having a plurality of wirings 222 on an upper surface, that is, a first surface 212 of the substrate 210, a plurality of first bonding pads 230 provided on the wiring layer 220 and a plurality of second bonding pads 264 provided on a lower surface, that is, the second surface 214 of the semiconductor substrate 210.

The substrate 210 may include a semiconductor material such as silicon, germanium, or silicon-germanium, or III-V compounds, e.g., gallium phosphide (GaP), gallium arsenide (GaAs), gallium antimonide (GaSb), etc.

The wiring layer 220 may include a plurality of insulating layers and a plurality of wirings 222 in the insulating layers. For example, the wirings may include a metal such as copper (Cu) or aluminum (Al).

The substrate 210 may include a plurality of through electrodes 240 formed to penetrate therethrough. The through electrode 240 may include a through silicon via (TSV). The through electrode 240 may be provided to extend in a thickness direction from (e.g., a direction perpendicular to) the first surface 212 of the substrate 210. One end portion of the through electrode 240 may contact the wiring 222 of the wiring layer 220. Accordingly, the wiring 222 may be electrically connected to the through electrode 240.

The first bonding pads 230 may be formed on the wiring layer 220 and may be electrically connected to the wirings 222. The first bonding pad 230 may be formed on a first redistribution pad 224 as an uppermost wiring of the wirings. A first protective layer pattern 232 may be formed on the wiring layer 220 to cover the first redistribution pads 224 and expose at least portions of the first bonding pads 230. For example, the first bonding pad 230 may include copper (Cu), aluminum (Al), tungsten, nickel (Ni), molybdenum (Mo), gold (Au), silver (Ag), or chromium (Cr), tin (Sn), titanium (Ti), etc. The first bonding pad 230 may have a diameter within a range of 5 μm to 40 μm.

The first protective layer pattern 232 may be formed on the wiring layer 220 and may cover the first redistribution pads 244 and expose at least portions of the first bonding pads 230. The first protective layer pattern may include a passivation layer including a nitride such as silicon nitride (SiN).

The second bonding pads 264 may be disposed on end portions of the through electrodes 240 exposed from the second surface 214 of the substrate 210. The second bonding pad 264 may be electrically connected to the through electrode 240. For example, one second bonding pad 264 may be electrically connected to two adjacent through electrodes 240. The second bonding pad 264 may have a rectangular shape. A length of one side of the second bonding pad 264 may be greater than the diameter of the first bonding pad 230. The length of one side of the second bonding pad 264 may be within a range of 25 μm to 200 μm.

A second protective layer pattern 270 may be provided on an insulating layer pattern 252 on the second surface 214 of the substrate 210 and may expose at least portions of the second bonding pads 264. For example, the second protective layer pattern 270 may include an insulating material such as Photo Imagable Dielectrics (PID).

The number, size, arrangement, etc. of the through electrodes, the insulating layers of the wiring layer, the wirings, the first redistribution pads, the first bonding pads, and the second bonding pads are provided as examples, and it should be understood are not limited thereto.

In example embodiments, the interposer 200 may be mounted on the package substrate 100 via the first conductive bumps 280 as conductive connecting members. The first conductive bumps 280 may be respectively disposed on the second bonding pads 264. The second bonding pad 264 of the interposer 200 may be electrically connected to a substrate pad 110 of the package substrate 100 by the first conductive bump 280. A protective layer pattern 120 may be disposed on the upper surface 102 of the package substrate 100 and may expose the substrate pads 110.

Each of the first conductive bumps 280 may include a pillar bump 282 and a solder bump 284 formed on the pillar bump 282. The pillar bump 282 may have a cylindrical shape or an elliptical column shape. The solder bump 284 may have a hemispherical shape or a semi-ellipsoidal shape.

For example, the pillar bumps 282 may have a single layer structure. The pillar bumps 282 may include a plating pattern layer including copper. The solder bumps 284 may include solder. Alternatively, the pillar bumps 282 may have a multi-layered structure. In this case, the pillar bump 282 may include first, second and third plating pattern layers sequentially stacked on one another. For example, the first and third plating pattern layers may include copper (Cu), and the second plating pattern layer may include nickel (Ni). A thickness H of the first conductive bump 280 may be within a range of 10 μm to 80 μm.

In example embodiments, the first semiconductor devices 300 may be disposed on the interposer 200. The first semiconductor devices 300 may be mounted on the interposer 200 by a flip chip bonding method. In this case, the first semiconductor devices 300 may be arranged on the interposer 200 such that an active surface, that is, a first surface 302 on which chip pads 310 are formed faces the interposer 200. The chip pads 310 of the first semiconductor devices 300 may be electrically connected to the first bonding pads 230 of the interposer 200 by second conductive bumps 330. For example, the second conductive bumps may include micro bumps (uBumps).

The second semiconductor devices 400 may be disposed on the interposer 200 to be spaced apart from the first semiconductor devices 300. The second semiconductor devices 400 may be mounted on the interposer 200 by a flip chip bonding method. In this case, the second semiconductor devices 400 may be arranged on the interposer 200 such that an active surface, that is, a first surface 402 on which chip pads 410 are formed faces the interposer 200. The chip pads 410 of the second semiconductor devices 400 may be electrically connected to the first bonding pads 230 of the interposer 200 by third conductive bumps 430. For example, the third conductive bumps 430 may include micro bumps (uBumps).

Although two first semiconductor devices 300 and eight second semiconductor devices 400 are disposed as shown in FIG. 2 for example, it should be understood that is the embodiments are not limited thereto. For example, in other embodiments the second semiconductor device 400 may include a buffer die and a plurality of memory dies (chips) sequentially stacked on the buffer die (not shown). The buffer die and the memory die may be electrically connected to each other by through silicon vias (TSVs).

The wirings 222 may be electrically connected to the through electrodes 240. The first and second semiconductor devices 300 and 400 may be electrically connected to the package substrate 100 through the wirings 222 and the through electrodes 240. The first semiconductor devices 300 and the second semiconductor devices 400 may be electrically connected to each other through the wirings 222.

In example embodiments, the first semiconductor devices 300 may include a first region CR and a second region PR. The first region CR may be a hot spot region where a relatively large amount of heat is emitted, and the second region PR may be a region where a relatively low amount of heat is emitted. The first region CR may be a region having a first current density, and the second region PR may be a region having a second current density lower than the first current density.

When viewed in plan view, the first region CR may have an island shape having a locally hot spot shape. The first region CR may be positioned in a middle region of the first semiconductor device 300, and the second region PR may be positioned around the first region CR.

In example embodiments, the sealing member 500 may cover the first and second semiconductor devices 300 and 400 on the interposer 200. The sealing member 500 may cover side surfaces of the first and second semiconductor devices 300 and 400 and may expose upper surfaces, that is, second surfaces 304 and 404 of the first and second semiconductor devices 300 and 400. An upper surface of the sealing member 500 may be coplanar with the upper surfaces 304 and 404 of the first and second semiconductor devices 300 and 400.

In example embodiments, a first concavo-convex pattern 350 may be provided in the upper surface 304 of the first semiconductor devices 300 exposed by the sealing member 500, and a second concavo-convex pattern 450 may be provided in the upper surface 404 of the second semiconductor devices 400 exposed by the sealing member 500. The first and second concavo-convex patterns 350 and 450 may be provided as portions of silicon surfaces of the first and second semiconductor devices 300 and 400.

The first concavo-convex pattern 350 may include a plurality of first pillar structures 352a provided in the upper surface 304 in the first region CR of the first semiconductor devices 300 and a plurality of second pillar structures 352b provided in the upper surface 304 in the second region PR of the first semiconductor devices 300. The second concavo-convex pattern 450 may include a plurality of third pillar structures provided in the upper surface 404 of the second semiconductor devices 400.

The plurality of first pillar structures 352a may be defined by first trenches 351a that are formed in the upper surface 304 of the first region CR of the first semiconductor device 300 to cross each other (e.g., see FIG. 4), and the plurality of second pillar structures 352b may be defined by second trenches 351b that are formed in the top surface 304 of the second region PR of the first semiconductor devices 300 to cross each other (e.g., see FIG. 4), and the plurality of third pillar structures may be defined by third trenches 451 that are formed in the upper surface 404 of the second semiconductor device 400 to cross each other. It should be understood that a concavo-convex pattern such as first concavo-convex pattern 350 may be characterized as having convex shaped portions (i.e., pillar structures) separated from each other by concave shaped portions (i.e., trenches).

As illustrated in FIGS. 1 and 3, the first pillar structures 352a may have a first width W1, and the second pillar structures 352b may have a second width W2 greater than the first width W1. The first pillar structures 352a may have a first height H1, and the second pillar structures 352b may have a second height H2 equal to or smaller than the first height H1. A first spacing distance P1 between adjacent first pillar structures 352a may be smaller than a second spacing distance P2 between adjacent second pillar structures 352b. The third pillar structures 450 may have a third width W3 greater than the first width W1 and third height H3 equal to or smaller than the first height H1, with a third spacing distance P3 between adjacent third pillar structures 450 greater than first spacing distance P1.

For example, the first and second heights H1 and H2 may be within a range of 1 m to 100 μm. A ratio (W1/P1) of the first width W1 of the first pillar structure 352a and the first spacing distance P1 between adjacent first pillar structures 352a may be within a range of 0.2 to 0.5. In one embodiment, the first width W1 of the first pillar structure 352a may be 1 μm and the first spacing distance P1 between adjacent first pillar structures 352a may be 4 μm.

The first, second and third pillar structures may have a cylindrical shape, a square pillar shape, a quadrangular column shape, a cone shape, a quadrangular truncated pyramid shape, a hemispherical shape, a truncated cone shape, etc. Widths (lengths of one side), heights, and spacing distances between the first, second, and third pillar structures may be determined by dimensions of the first, second, and third trenches. The widths (lengths of one side), heights, and spacing distances of the first, second, and third pillar structures may be determined in consideration of the heat dissipation regions of the first and second semiconductor devices 300 and 400, heat dissipation amount per unit area, etc.

In example embodiments, the underfill member 600 may be underfilled between the first semiconductor device 300 and the interposer 200 to fill a space between the first conductive bumps 280.

The underfill member may include a material having relatively high fluidity to effectively fill a small space between the interposer and the package substrate. For example, the underfill member may include an adhesive including an epoxy material.

Although not illustrated in the figures, second underfill members may be underfilled between the first semiconductor device 300 and the interposer 200, and between the second semiconductor device 400 and the interposer 200. The second underfill member may be substantially the same as the underfill member 600.

External connection pads 130 may be formed on a lower surface 104 of the package substrate 100, and external connection members 150 may be disposed on the external connection pads 130 for electrical connection with external devices. For example, the external connection member 150 may be a solder ball. A protective layer pattern 140 may be disposed on the lower surface 104 of the package substrate 100 and may expose the external connection pads 130. The semiconductor package 10 may be mounted on a module substrate (not illustrated) via the solder balls to form a memory module.

In example embodiments, the reinforcing member 650 may extend on the package substrate 100 to surround the interposer 200. The reinforcing member 650 may include a stiffener. The reinforcing member 650 may be attached on an upper surface 102 of the package substrate 100 by an adhesive.

The reinforcing member 650 may include a ring-shaped sidewall structure extending along a peripheral region of the interposer 200. Alternatively, the reinforcing member 650 may include four sidewall structures extending along the peripheral region of the interposer 200. The sidewall structure may prevent warpage of the package substrate 100. A height of the reinforcing member 300 from the package substrate 100 may be greater than or equal to a height of the sealing member 500.

As described above, the semiconductor package 10 may include the interposer 200 mounted on the package substrate 100 via the first conductive bumps 280, and the first and second semiconductor devices 300 and 400 disposed on the interposer 200, the sealing member 500 on the interposer 200 and exposing the upper surfaces 304 and 404 of the first and second semiconductor devices 300 and 400, and the first and second concavo-convex patterns 350 and 450 serving as the heat dissipation pattern structures provided on the upper surfaces 304 and 404 of the first and second semiconductor devices 300 and 400 exposed by the sealing member 500.

The first semiconductor device 300 may include the first region CR as the hot spot region having the first current density and the second region PR having the second current density lower than the first current density. The first concavo-convex pattern 350 may include the plurality of first pillar structures 352a provided in the upper surface 304 of the first region CR of the first semiconductor device 300 and the plurality of second pillar structures 352b provided in the upper surface 304 of the second region PR of the first semiconductor device 300.

In the molded interposer package 10, the plurality of first pillar structures 352a may be formed in the hot spot region CR on the surface where the silicon interface of the first semiconductor device 300 is exposed, to thereby provide a thermal silicon fin surface. Accordingly, the heat of the hot spot may be effectively dissipated and the heat transfer surface area may be maximized.

The widths, heights, and spacing distances of the first and second pillar structures 352a and 352b may be adjusted according to the location and size of the hot spot area to provide effective passive cooling performance Thus, operation reliability of HBM may be ensured, and it may be applied as one of the thermal management solutions of high performance computing (HPC) and automotive architectures in which various heterogeneous chips are integrated.

Hereinafter, a method of manufacturing the semiconductor package of FIG. 1 will be described.

Figure 6:
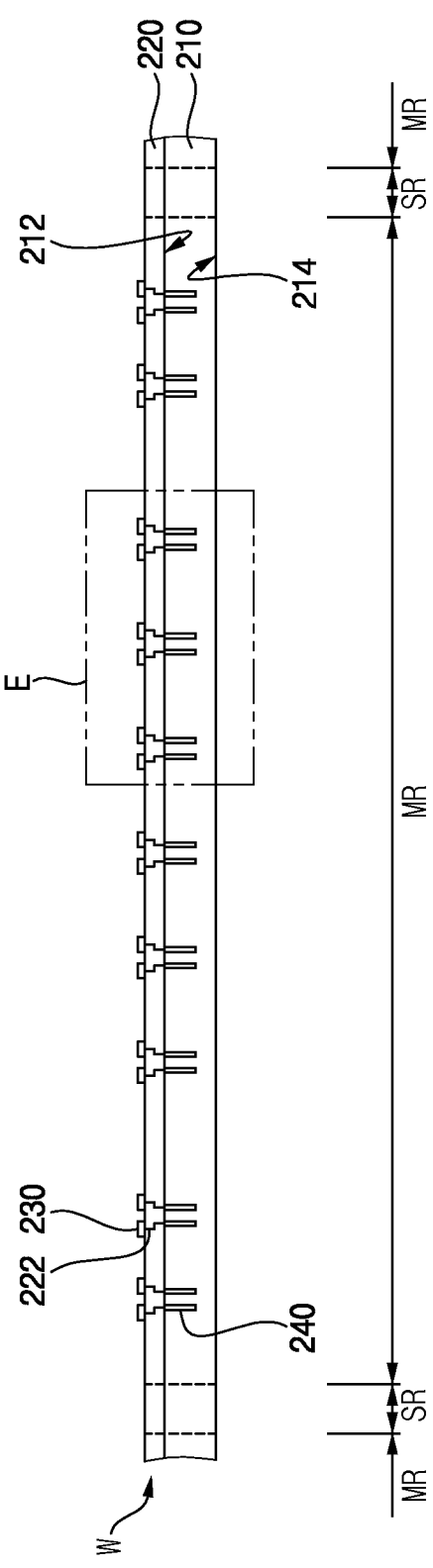
Figure 7:
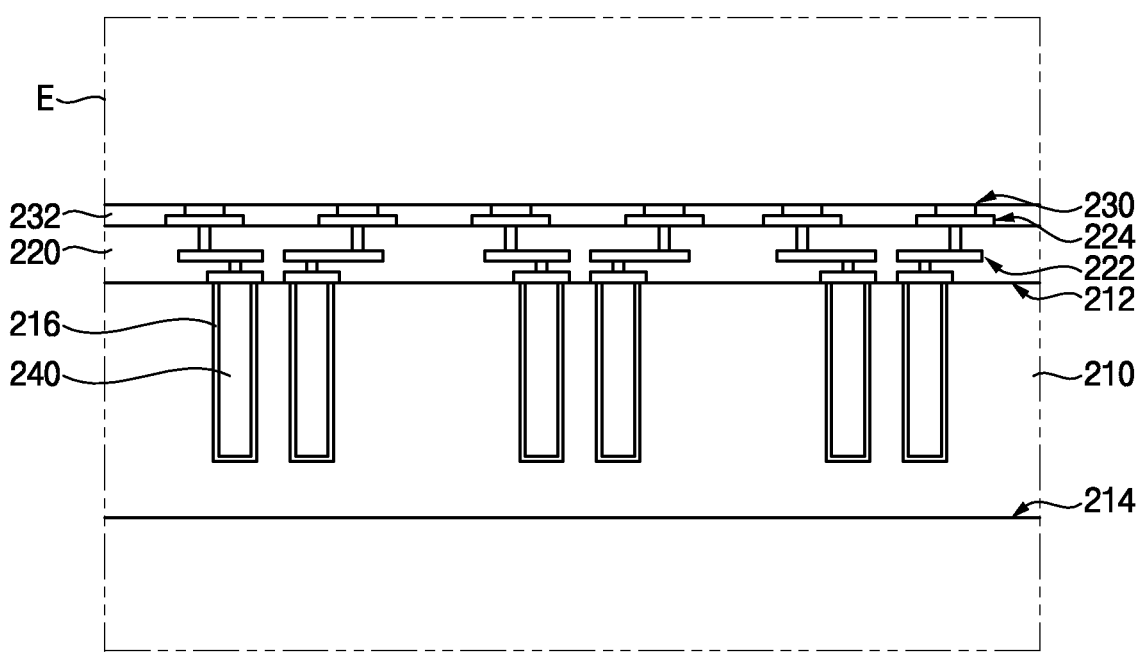
Figure 14:
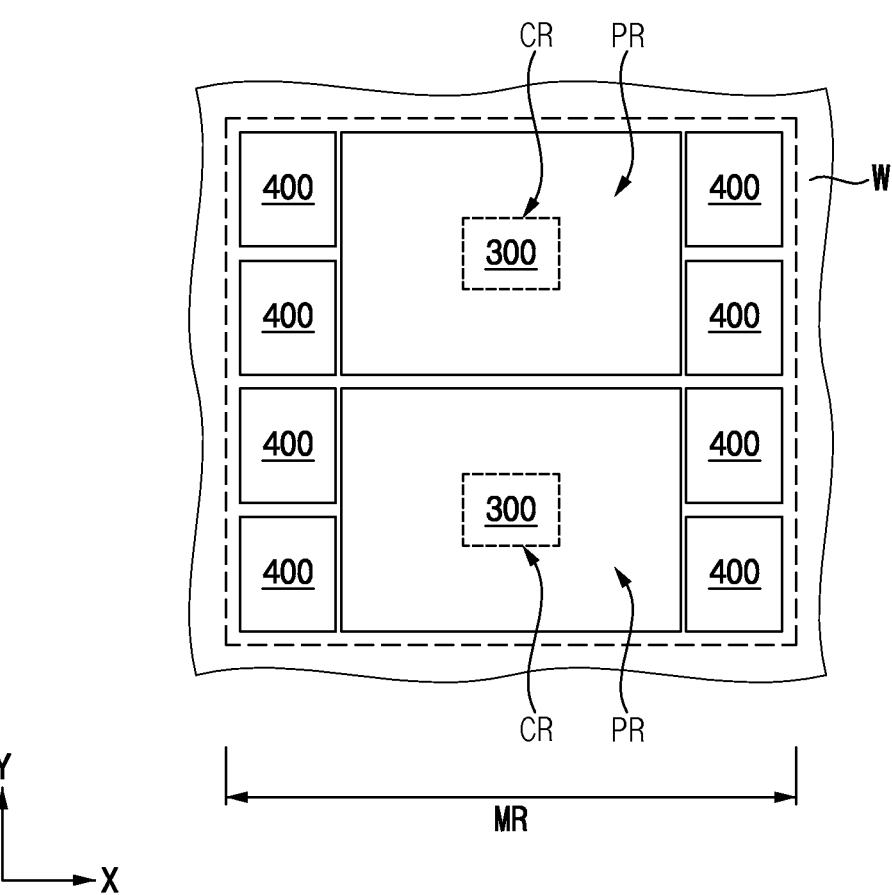
Figure 17:
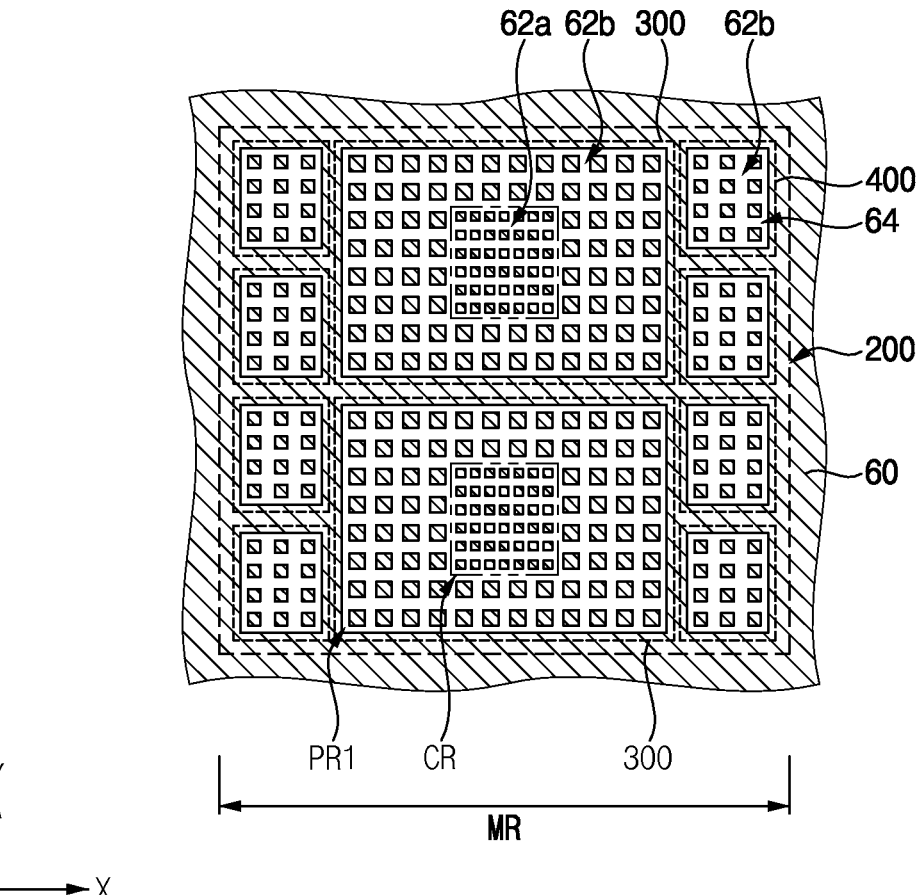
Figure 18:
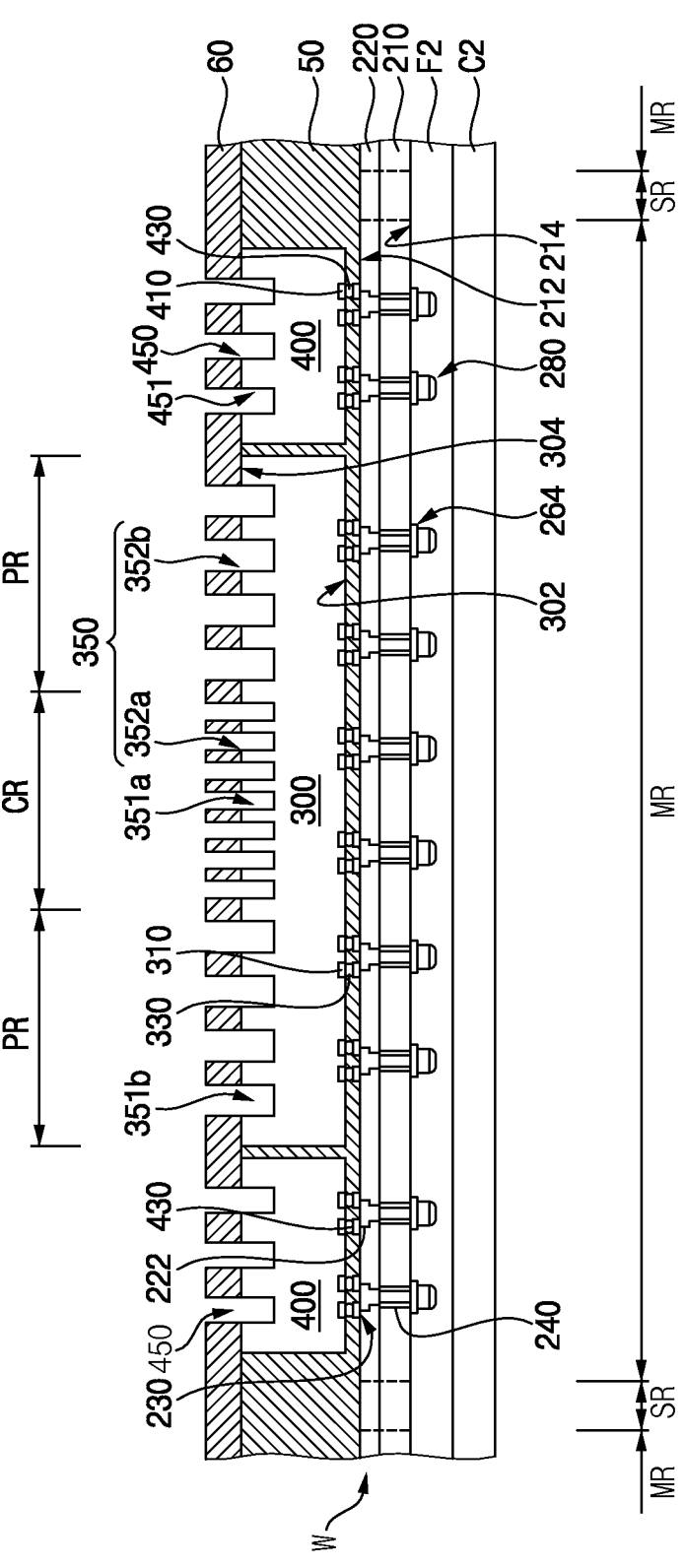
Figure 19:
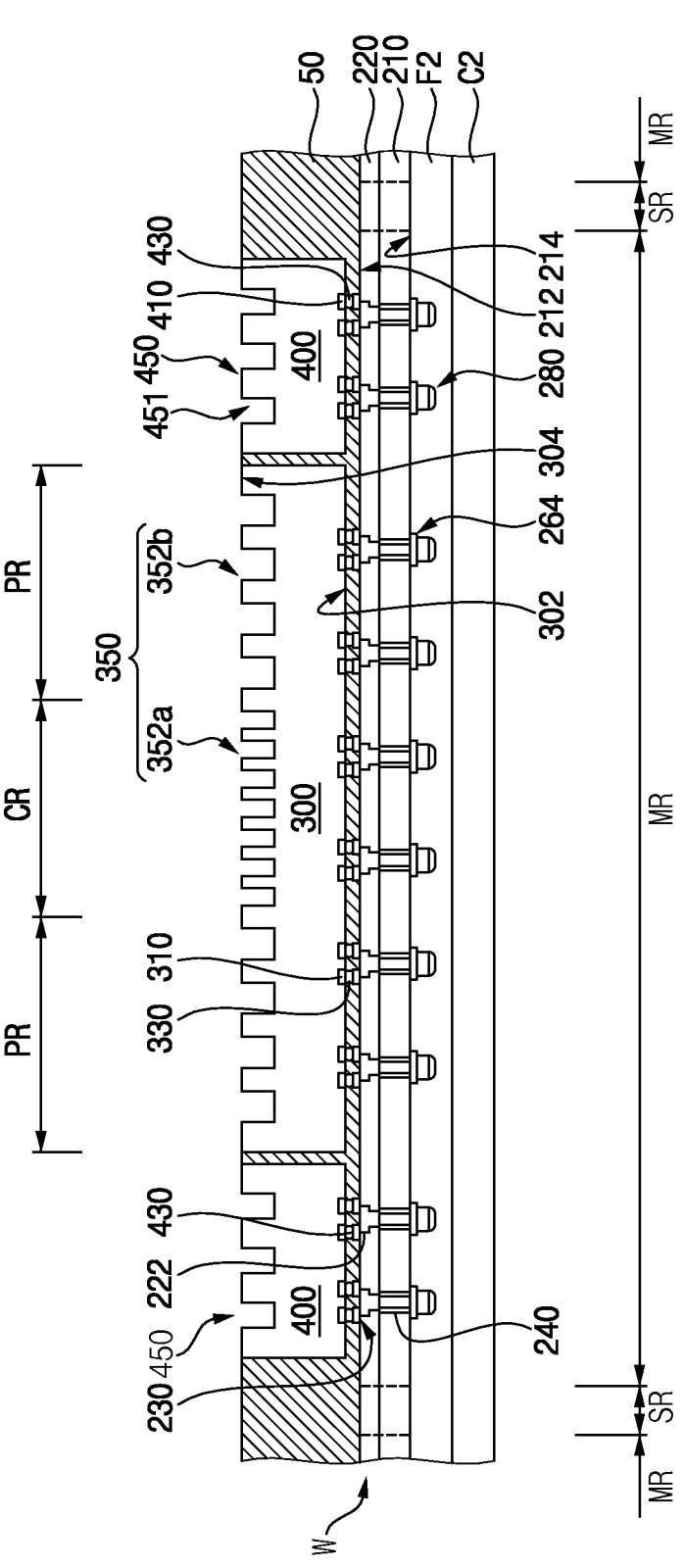

FIGS. 5 to 22 illustrate views descriptive of a method of manufacturing a semiconductor package in accordance with example embodiments. FIG. 5 is a top plan view of a semiconductor wafer W. FIG. 6 illustrates a cross-sectional view taken along the line D-D' in FIG. 5. FIG. 7 illustrates an enlarged cross-sectional view of portion 'E' in FIG. 6. FIG. 11 illustrates an enlarged cross-sectional view of portion 'F' in FIG. 10. FIG. 14 illustrates a plan view of FIG. 13. FIG. 17 illustrates a plan view of FIG. 16.

Referring to FIGS. 5 to 7, first, a semiconductor wafer W for a silicon interposer may be provided.

In example embodiments, the wafer W may include a substrate 210 and a wiring layer 220. The substrate 210 may have a first surface 212 and a second surface 214 opposite the first surface 212. The wiring layer 220 may be provided on the first surface 212 of the substrate 210.

The wafer W may include a package region, that is, a mounting area MR where semiconductor device(s) are mounted and a scribe lane region, that is, a cutting region SR surrounding the mounting area MR. As described later, the wafer W may be cut along the cutting region SR that divides the mounting region MR to be individualized into an interposer. For example, the mounting region a MR may have an area of 5 mm×6 mm or more. A length of one side of the mounting region MR may be within a range of 5 mm to 90 mm.

For example, the substrate 210 may include a semiconductor material such as silicon, germanium, silicon-germanium, or a group III-V compound semiconductor such as gallium phosphide (GaP), gallium arsenide (GaAs), or gallium antimonide (GaSb). In some embodiments, the substrate 210 may be a silicon-on-insulator (SOI) substrate or a germanium-on-insulator (GOI) substrate.

The substrate 210 may include a plurality of through electrodes (through silicon vias) 240 that are formed therein to extend in a thickness direction. The through electrodes 240 may be electrically connected to wirings 222, respectively. The through electrode may be formed before grinding a backside surface of the substrate 210, that is, the second surface 214. Alternatively, the through electrode may be formed after grinding the backside surface of the substrate 210 as illustrated in FIG. 11.

For example, a via hole may be formed to extend from the first surface 212 of the substrate 210 by a predetermined depth, and an insulating layer 216 may be formed along the profile of a sidewall and a bottom surface of the via hole and the first surface 212 of the substrate 210. For example, the depth of the via hole may be within a range of 10 μm to 120 μm.

Then, after a barrier metal layer and a seed layer are sequentially formed on the insulating layer 216, a conductive layer may be formed on the seed layer. The barrier metal film may be formed of materials such as for example Ta, TaN, Ti, TiN, Ru, Co, Ni, NiB, WN, etc., and these may be used alone or as a mixture or combination thereof. The seed layer may be formed by depositing copper through a physical vapor deposition process.

Then, the conductive layer may be formed on the seed layer to fill the via hole. The conductive layer may be formed by depositing copper by an electrolytic plating process, an electroless plating process, an electrografting process, a physical vapor deposition process, or the like. The conductive layer, the barrier metal layer and the insulating layer may be polished by a chemical mechanical polishing process to form the through electrode 240.

The wiring layer 220 may be formed on the first surface 212 of the substrate 210. The wiring layer 220 may be formed by a back process referred to as BEOL (Back End of Line) process. The wiring layer 220 may include a plurality of insulating layers and a plurality of wirings 222 in the insulating layer. For example, the wirings 222 may include a metal such as copper (Cu) or aluminum (Al). Some of the wirings 222 may be formed on the through electrode 240. Accordingly, the wiring 222 may be electrically connected to the through electrode 240.

First bonding pads 230 may be formed on the wiring layer 220 and may be electrically connected to the wirings 222. The first bonding pads 230 may be formed on first redistribution pads 224 as an uppermost wiring of the wirings. A first protective layer pattern 232 may be formed on the wiring layer 220 to cover the first redistribution pads 224 and expose at least portions of the first bonding pads 230.

For example, a first passivation layer (i.e., first protective layer pattern 232) may be formed on the wiring layer 220, the first passivation layer may be patterned to expose at least portions of the first redistribution pads 224, and the first bonding pads 230 may be formed on the exposed portions of the first redistribution pads 224. The first bonding pads 230 may be formed by a plating process. For example, the first bonding pad 230 may include copper (Cu), aluminum (Al), tungsten, nickel (Ni), molybdenum (Mo), gold (Au), silver (Ag), chromium (Cr), tin (Sn), titanium (Ti), etc. The first bonding pad 230 may have a diameter within a range of 5 μm to 40 μm.

Although not illustrated in the figures, a plating layer may be formed on the first bonding pad 230. The plating layer may include a metal different from that of the first bonding pad.

For example, the insulating layers may be formed to include an oxide such as silicon oxide, carbon-doped oxide, or fluorine-doped oxide. The first passivation layer may include a passivation layer including a nitride such as silicon nitride (SiN). In addition, the first passivation layer may include an organic passivation layer including an oxide layer and an inorganic passivation layer including a nitride layer and sequentially stacked on the organic passivation layer.

The wirings and the redistribution pads may include a metal material such as aluminum (Al) or copper (Cu).

The number, size, arrangement, etc. of the insulating layers, the wirings, the first redistribution pads, and the first bonding pads of the wiring layer are provided as examples, and it should be understood that they are not limited in number size and arrangement.

Referring to FIGS. 8 to 11, second bonding pads 264 may be formed on the second surface 214 of the substrate 210, and conductive bumps 280 as conductive connection members may be formed on the second bonding pads 264.

Figure 8:
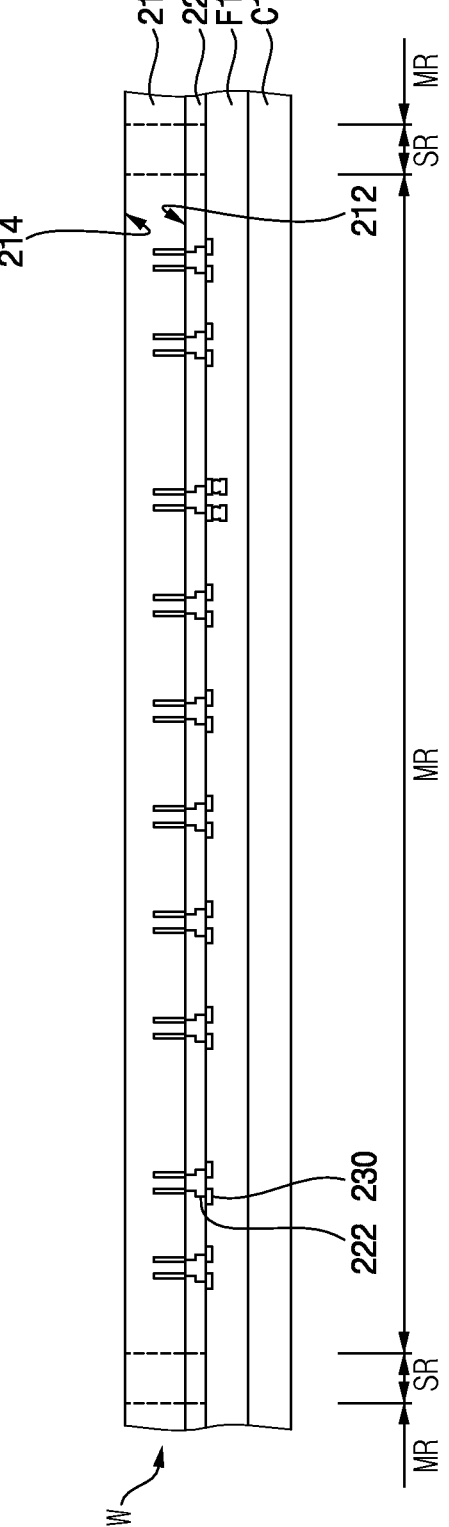
Figure 9:
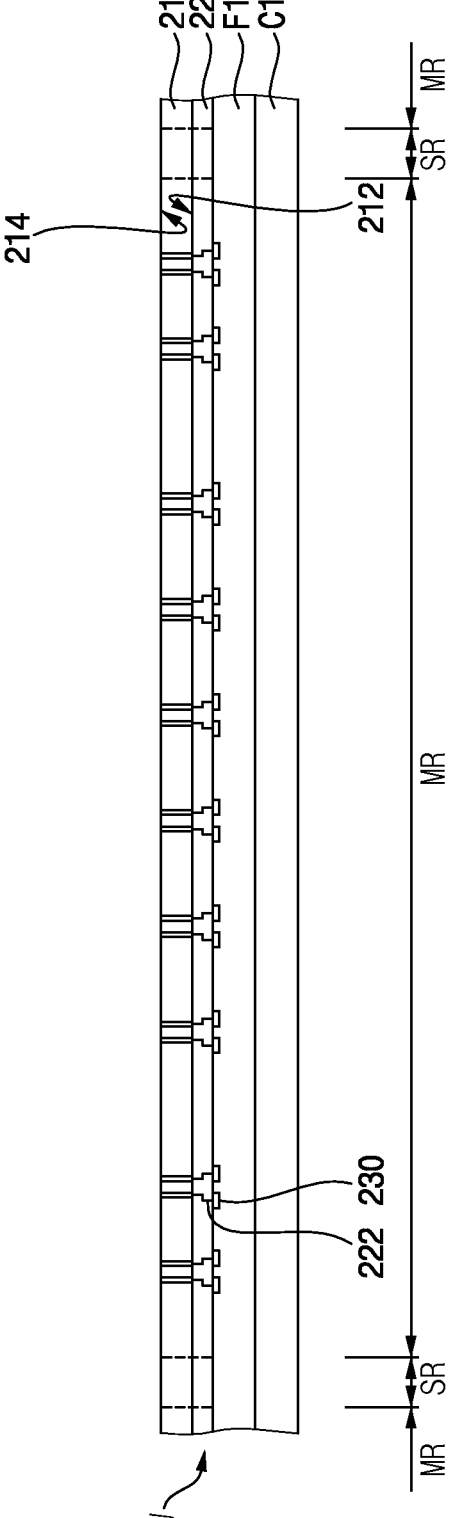

As illustrated in FIGS. 8 and 9, the backside surface of the substrate 210, that is, the second surface 214 may be polished using a substrate support system (WSS). The wafer W may be adhered on a first carrier substrate C1 using a first adhesive film F1, and the second surface of the substrate 210 may be grinded until portions of the through electrodes 240 are exposed.

The second surface 214 of the substrate 210 may be partially removed by a grinding process such as a chemical mechanical polishing (CMP) process. Thus, a thickness of the substrate 210 may be reduced to a desired thickness. For example, the substrate 210 may have a thickness ranging from about 40 μm to about 150 μm. Then, a silicon recess etching process may be performed on the second surface 214 of the substrate 210 to expose one end portion of the through electrode 240 from the second surface 214 of the substrate 210.

Figure 10:
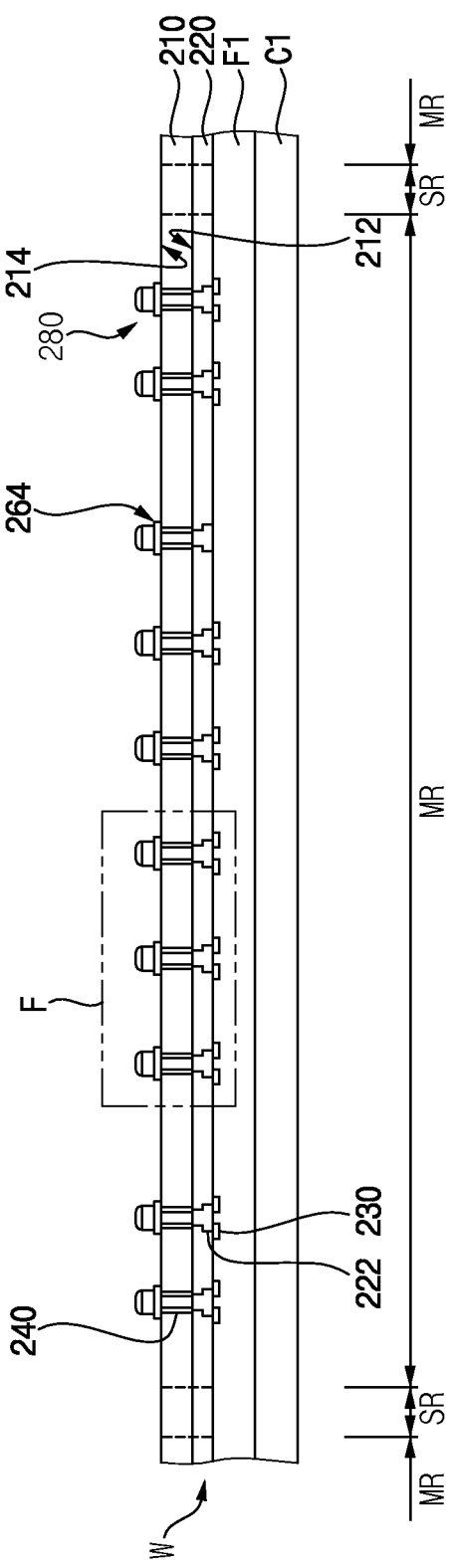
Figure 11:
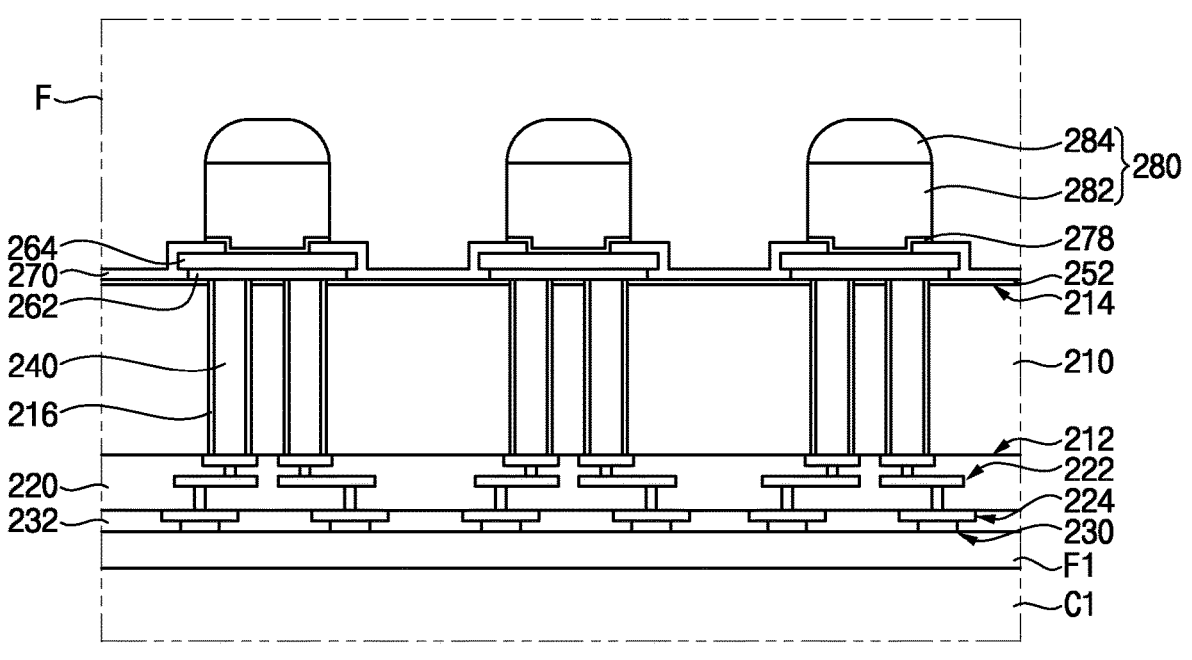

As illustrated in FIGS. 10 and 11, an insulating layer pattern 252 may be formed on the second surface 214 of the substrate 210 to expose end portions of the through electrodes 240, a seed layer may be formed on the insulating layer pattern 252 on the second surface 214 of the substrate 210 and the exposed end portions of the through electrodes 240, and a first photoresist pattern having openings that expose second bonding pad regions may be formed on the seed layer. The opening of the first photoresist pattern may simultaneously expose end portions of two through electrodes 240 adjacent each other.

For example, the seed layer may be formed by a deposition process. The seed layer may include nickel (Ni), copper (Cu), titanium (Ti), tantalum (Ta), etc.

Then, the openings of the first photoresist pattern may be filled up with a conductive material to form the second bonding pads 264, the first photoresist pattern may be removed from the wafer W, and portions of the seed layer exposed by the second bonding pads 264 may be removed to form a seed layer pattern 262.

The second bonding pad 264 may be formed by a plating process. The second bonding pad 264 may be formed on the through electrode 240. The second bonding pad 264 may be electrically connected to the through electrode 240. For example, one second bonding pad 264 may be electrically connected to two adjacent through electrodes 240. The second bonding pad 264 may have a rectangular shape. A length of one side of the second bonding pad 264 may be within a range of 25 μm to 200 μm.

Then, a second protective layer pattern 270 may be formed on the insulating layer pattern 252 exposing at least a portion of the second bonding pad 264. For example, the second protective layer pattern 270 may include an insulating material such as Photo Imagable Dielectrics (PID). A photosensitive insulating layer may be formed on the insulating layer pattern 252 to cover the second bonding pads 264, and the photosensitive insulating layer may be patterned by a photo process to form openings that expose the portions of the second bonding pads 264.

A seed layer may be formed on the second protective layer pattern 270 and the exposed portions of the second bonding pads 264, and a second photoresist pattern may be formed having openings that expose first bump structure regions on the seed layer. The opening of the second photoresist pattern may have a diameter within a range of 20 μm to 200 μm.

Then, the openings of the second photoresist pattern may be filled up with a conductive material to form bump structures, the second photoresist pattern may be removed from the wafer W, and portions of the seed layer exposed by the bump structures may be removed to form a seed layer pattern 278.

For example, the bump structure may include circular or elliptical pillar bumps 282 and solder bumps 284 formed on the pillar bumps 282. The pillar bumps 282 may have a single layer structure. The pillar bumps 282 may include a plating pattern layer including copper. The solder bumps 284 may include solder.

Alternatively, the pillar bumps 282 may have a multilayered structure. In this case, the pillar bump 282 may include first, second and third plating pattern layers sequentially stacked on one another. The first and third plating pattern layers may include copper (Cu), and the second plating pattern layer may include nickel (Ni).

Then, a reflow process may be performed on the solder bumps 284 to form the first conductive bumps 280 on the second bonding pads 264.

The first conductive bumps 280 may include the pillar bumps 282 and the solder bumps 284 formed on the pillar bumps 282. However, embodiments are not limited thereto, and for example, the first conductive bumps may include only solder bumps. A height of the first conductive bump 280 may be within a range of 10 μm to 80 μm.

When thicknesses of the pillar bumps 282 are relatively small, the pillar bumps 282 may be referred to as second bonding pads, and the second bonding pads 264 may be referred to as second redistribution pads.

Then, the first carrier substrate C1 may be removed from the wafer W.

Figure 12:
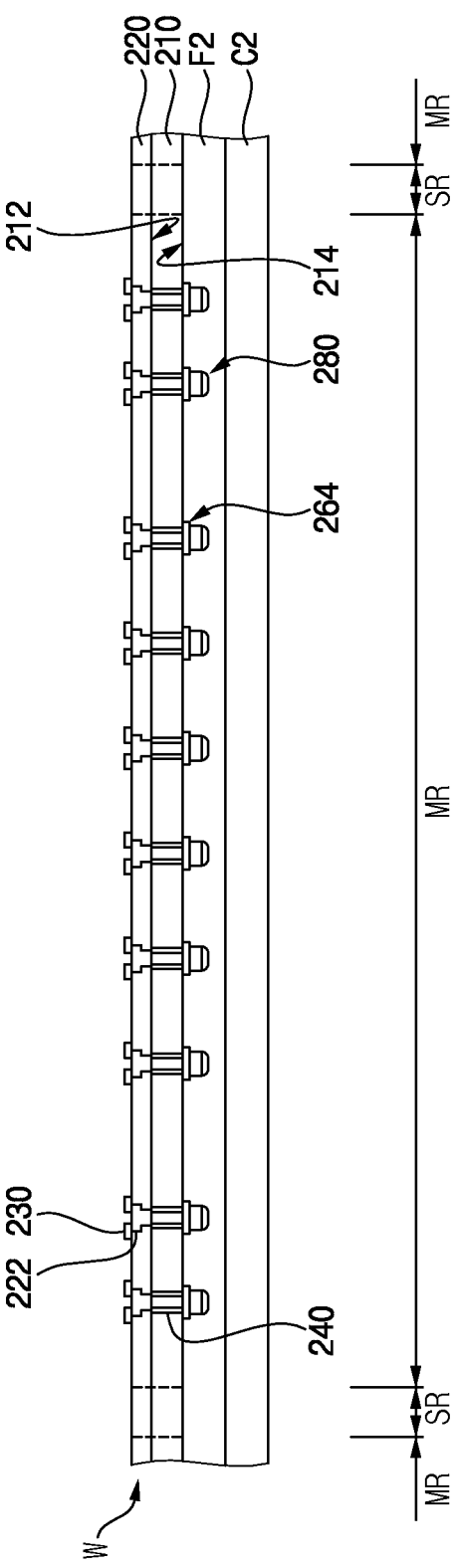
Figure 13:
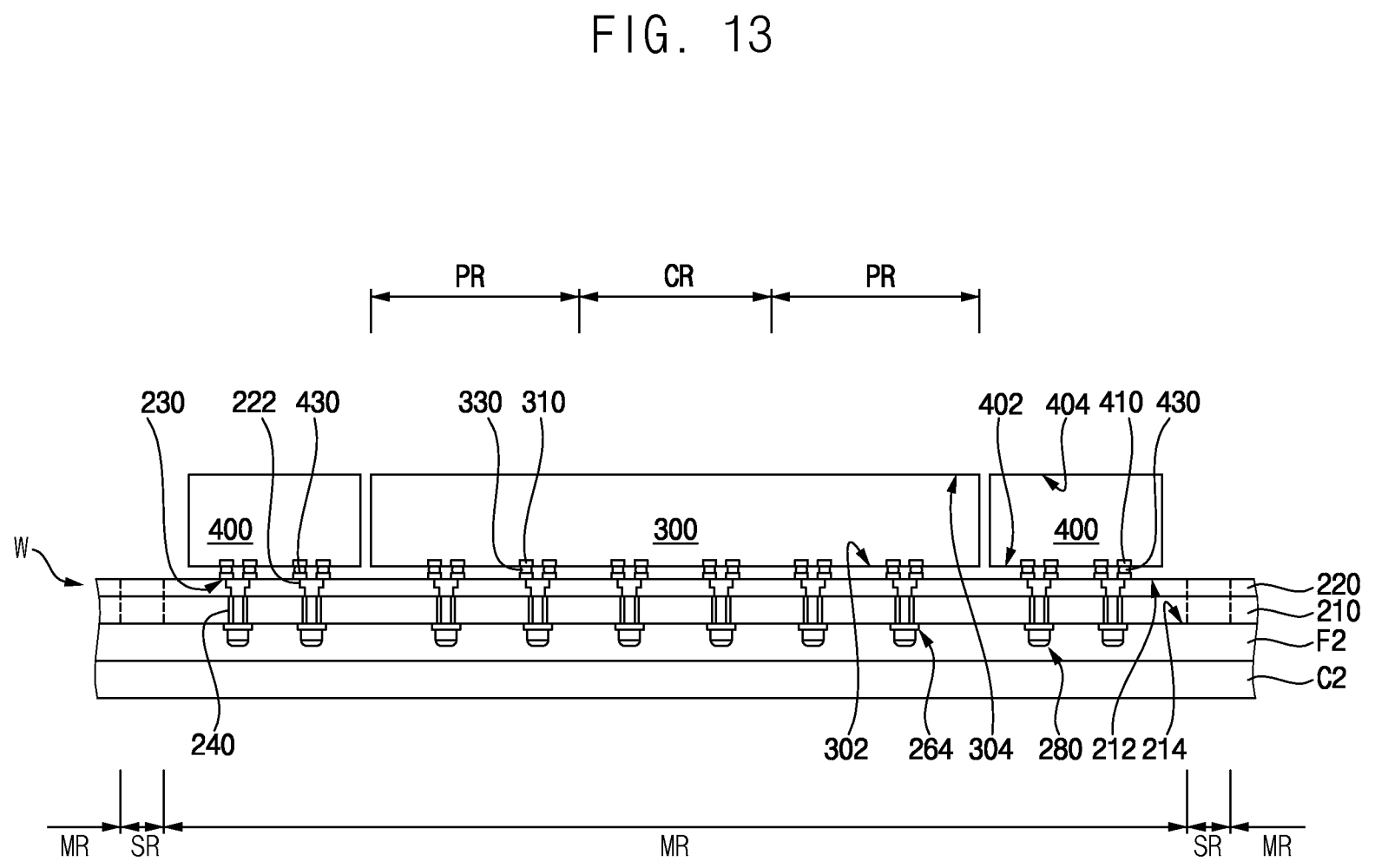

Referring to FIGS. 12 to 14, the structure of FIG. 11 may be turned over, and a first semiconductor device 300 and second semiconductor devices 400 may be mounted on the wiring layer 220 respectively. Then, an underfill member may be formed between the first semiconductor device 300 and the wiring layer 220, and an underfill member may be formed between the second semiconductor device 400 and the wiring layer 220.

As illustrated in FIG. 12, the wafer W may be attached onto a second carrier substrate C2 using a second adhesive film F2. The wafer W may be attached onto the second carrier substrate C2 such that the first bonding pads 230 face upwardly to be exposed.

As illustrated in FIG. 13, the first semiconductor device 300 and the second semiconductor devices 400 may be arranged on the wiring layer 220 to be spaced apart from each other. The first semiconductor device 300 may be arranged in a middle region of the mounting region MR, and the second semiconductor devices 400 may be disposed at both sides of the first semiconductor device 300.

In example embodiments, the first and second semiconductor devices may be mounted on the wiring layer 220 by a flip chip bonding method. The first semiconductor device 300 may be arranged such that a front surface 302 on which chip pads 310 are formed faces the wiring layer 220. The second semiconductor device 400 may be arranged such that a front surface 402 on which chip pads 410 are formed faces the wiring layer 220.

The chip pads 310 of the first semiconductor device 300 may be electrically connected to the first bonding pads 230 of the wiring layer 220 by second conductive bumps 330. The chip pads 410 of the second semiconductor device 400 may be electrically connected to the first bonding pads 230 of the wiring layer 220 by third conductive bumps 430. For example, the second and third conductive bumps 330 and 430 may include micro bumps (uBumps).

For example, the first semiconductor device 300 may include a logic semiconductor device, and the second semiconductor device 400 may include a memory device. The logic semiconductor device may be an ASIC as a host such as a CPU, GPU, or SoC. The memory device may include a high bandwidth memory (HBM) device. In this case, the second semiconductor device may include a buffer die and a plurality of memory dies (chips) sequentially stacked on the buffer die. The buffer die and the memory dies may be electrically connected to each other by through silicon vias.

The first semiconductor device 300 may include a first region CR and a second region PR. The first region CR may be a hot spot region where a relatively large amount of heat is emitted, and the second region PR may be a region where a relatively low amount of heat is emitted. The first region CR may be a region having a first current density, and the second region PR may be a region having a second current density lower than the first current density.

When viewed in plan view, the first region CR may have an island shape having a locally hot spot shape. The first region CR may be positioned in a middle region of the first semiconductor device 300, and the second region PR may be positioned around the first region CR.

Although two first semiconductor devices 300 and eight second semiconductor devices 400 are shown as disposed in FIG. 14, it should be understood that the respective numbers of devices are not limited thereto.

Figure 15:
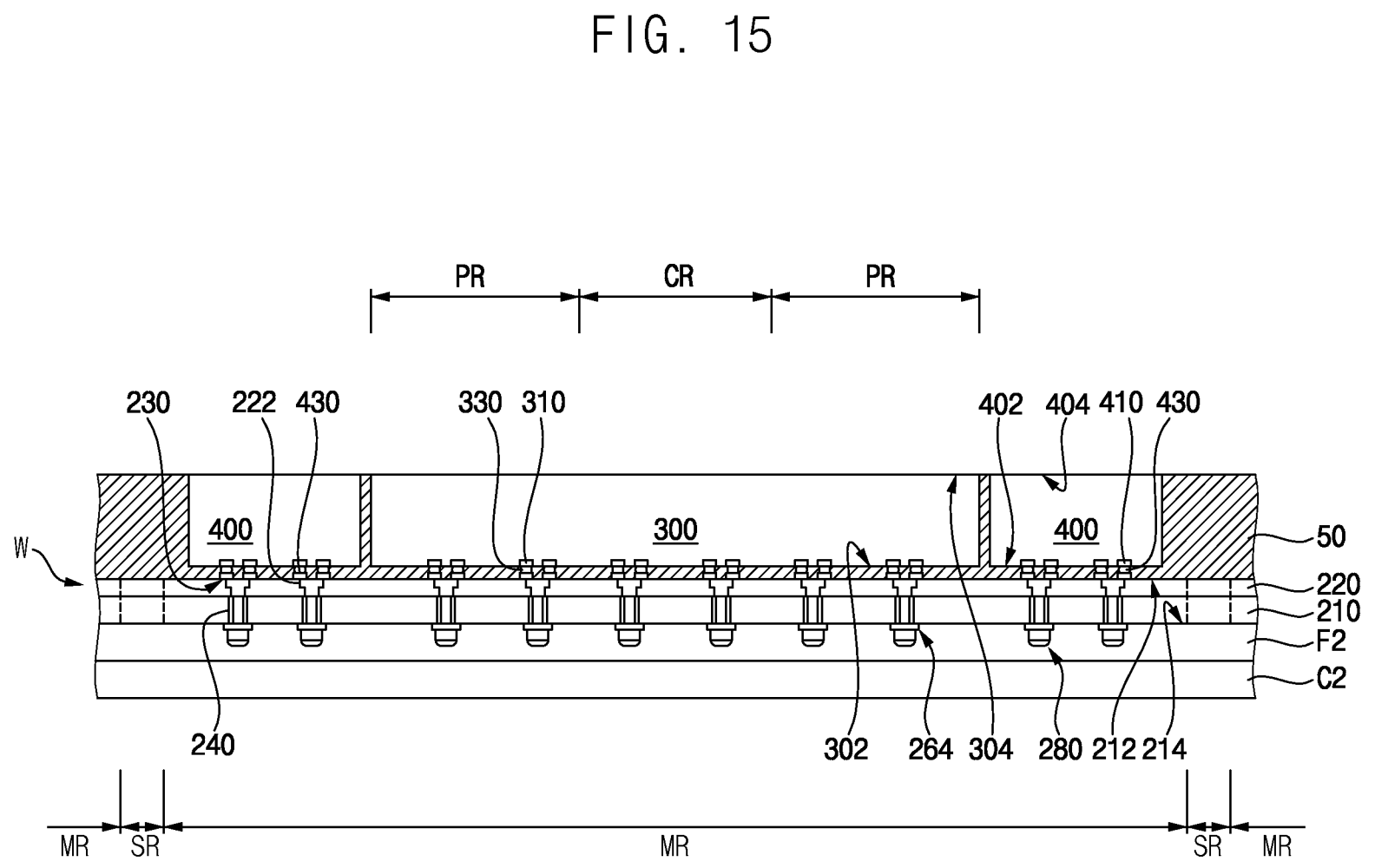

Referring to FIG. 15, a sealing material 50 may be formed on the wiring layer 220 to cover the first semiconductor device 300 and the second semiconductor devices 400.

In example embodiments, after forming the sealing material 50 covering the first and second semiconductor devices 300 and 400 on the wiring layer 200, the sealing material 50 may be partially removed to expose backside surfaces 304 and 404, that is, upper surfaces of the first and second semiconductor devices 300 and 400. Accordingly, the sealing material 50 may expose the upper surfaces 304 and 404 of the first and second semiconductor devices 300 and 400.

For example, the sealing material 50 may be formed by a compression molding method or a transfer molding method. An upper surface of the sealing material 50 may be removed by a two-step grinding process to expose the upper surfaces 304 and 404 of the first and second semiconductor devices 300 and 400. The upper surface of the sealing material 50 may be roughly removed by the first-step grinding process, and the upper surface of the sealing material 50 may be finely removed by the second-step grinding process, so that the upper surfaces 304 and 404 of the first and second semiconductor devices 300 and 400 may be exposed.

Referring to FIGS. 16 to 19, first and second concavo-convex patterns 350 and 450 as heat dissipation pattern structures may be formed in the upper surfaces 304 and 404 of the first and second semiconductor devices 300 and 400 exposed by the sealing material 50, respectively.

Figure 16:
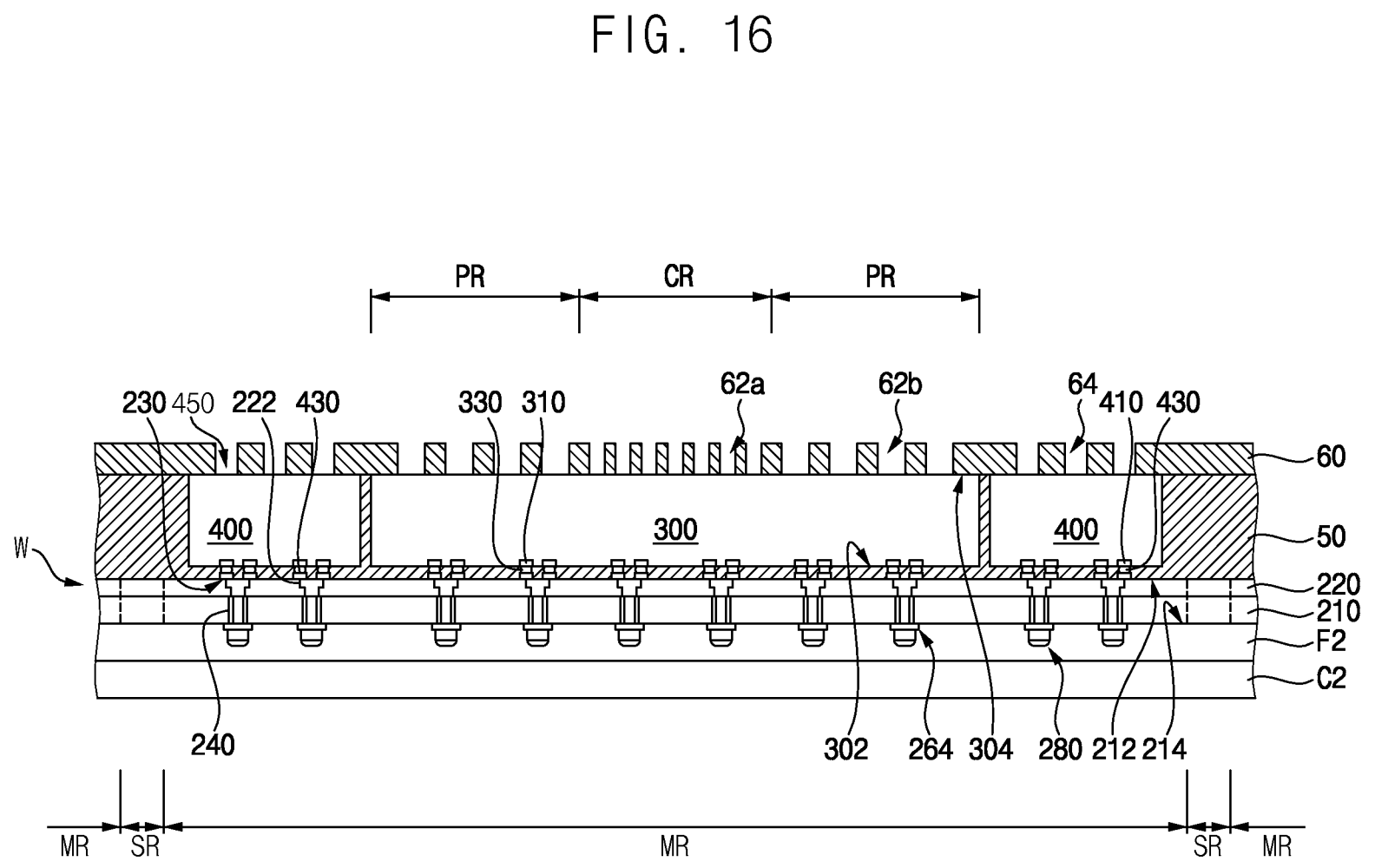

As illustrated in FIGS. 16 and 17, a third photoresist pattern 60 may be formed on the upper surfaces 304 and 404 of the first and second semiconductor devices 300 and 400 to have first openings 62a that expose first trench regions in the first region CR of the first semiconductor device 300, second openings 62b that expose second trench regions in the second region PR of the first semiconductor device 300, and third openings 64 that expose third trench regions in the second semiconductor device 400. A sacrificial layer pattern such as an amorphous carbon layer (ACL) may be formed instead of the third photoresist pattern 60.

As illustrated 18 and 19, the upper surfaces 304 and 404 of the first and second semiconductor devices 300 and 400 may be partially removed using the third photoresist pattern 60 as an etching mask to form the first and second concavo-convex patterns 350 and 450 in the upper surfaces 304 and 404 of the first and second semiconductor devices 300 and 400, and the third photoresist pattern 60 may be removed from the wafer W.

The first concavo-convex pattern 350 may include a plurality of first pillar structures 352a provided in the upper surface 304 in the first region CR of the first semiconductor device 300 and a plurality of second pillar structures 352b provided in the upper surface 304 in the second region PR of the first semiconductor device 300. The second concavo-convex pattern 450 may include a plurality of third pillar structures provided in the upper surface 404 of the second semiconductor device 400.

The plurality of first pillar structures 352a may be defined by first trenches 351a that are formed in the upper surface 304 of the first region CR of the first semiconductor device 300 to cross each other, and the plurality of second pillar structures 352b may be defined by second trenches 351b that are formed in the top surface 304 of the second region PR of the first semiconductor device 300 to cross each other, and the plurality of third pillar structures may be defined by third trenches 451 that are formed in the upper surface 404 of the second semiconductor device 400 to cross each other.

The first, second and third pillar structures may have for example a cylindrical shape, a square pillar shape, a quadrangular column shape, a cone shape, a quadrangular truncated pyramid shape, a hemispherical shape, a truncated cone shape, etc. Widths (lengths of one side), heights, and spacing distances between the first, second, and third pillar structures may be determined by dimensions of the first, second, and third trenches. The widths (lengths of one side), heights, and spacing distances of the first, second and third pillar structures may be determined in consideration of the heat dissipation regions of the first and second semiconductor devices 300 and 400, heat dissipation amount per unit area, etc.

Figure 20:
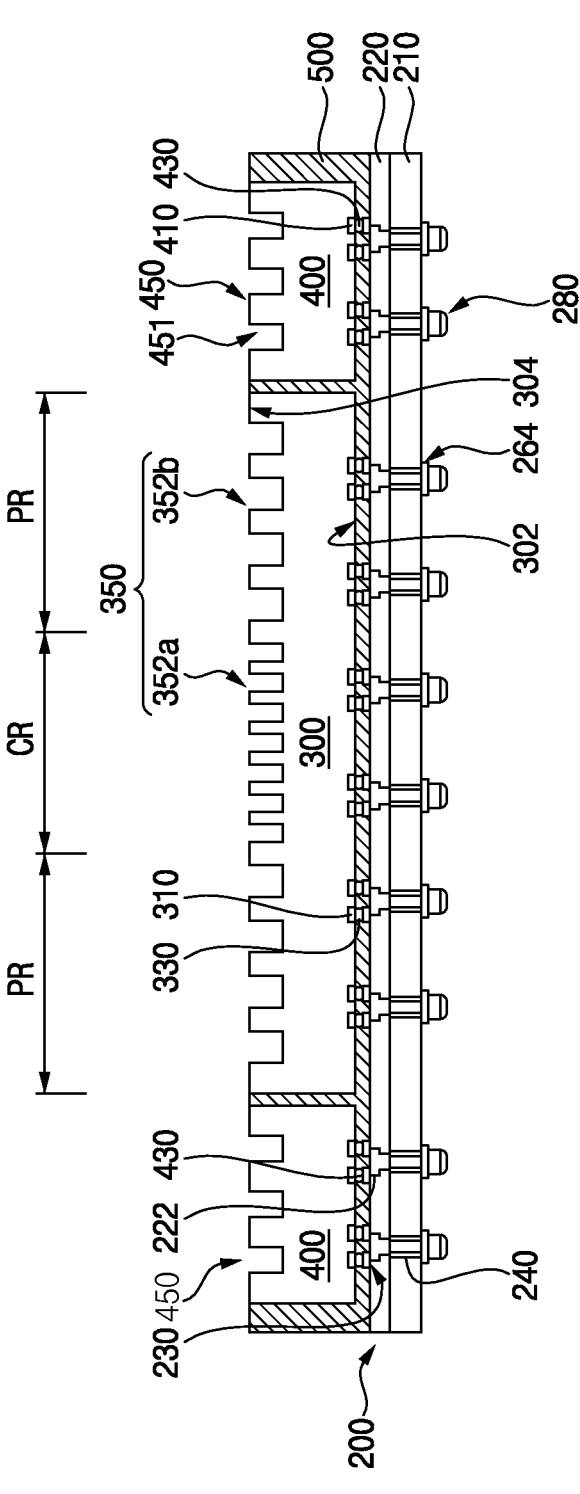

Referring to FIG. 20, the wafer W may be cut along the cutting region SR to form the individual interposer 200.

In example embodiments, when the wafer W is sawed by a sawing process, a portion of the sealing material 50 on the cutting region SR may also be sawed to form a sealing member 500.

Figure 21:
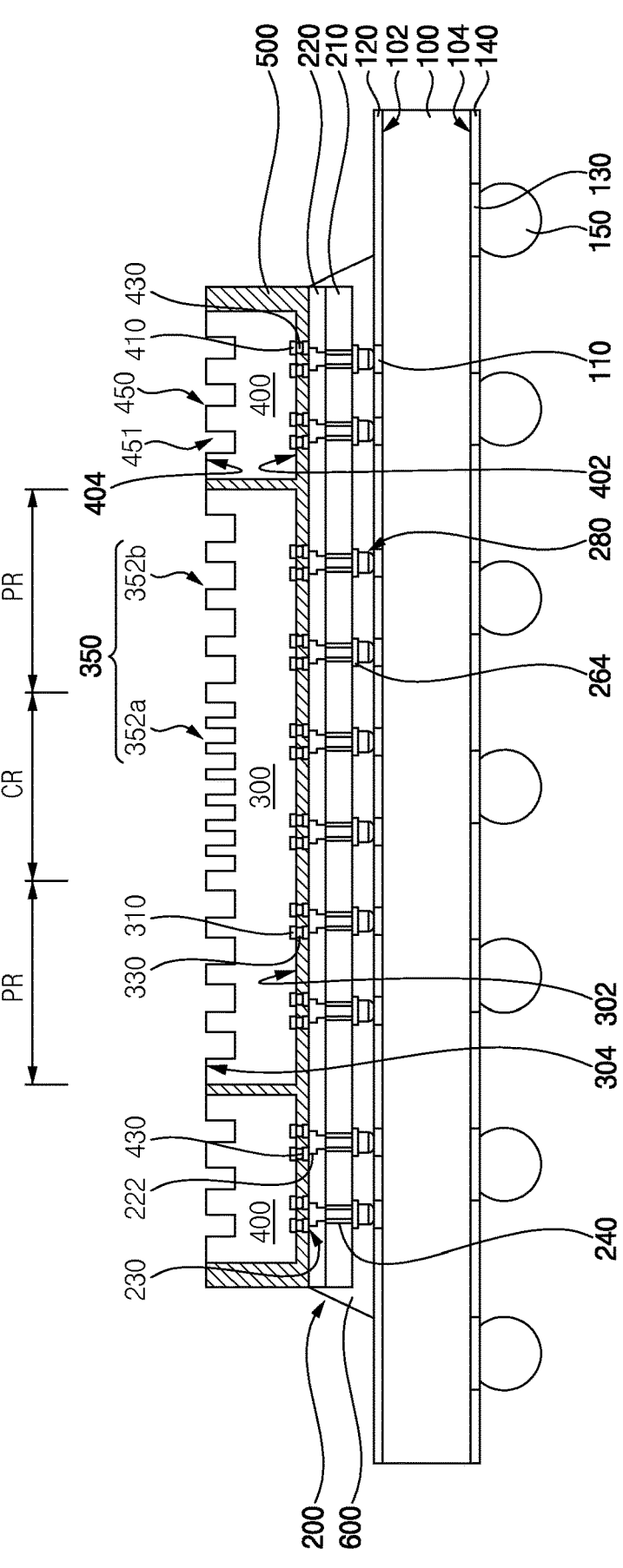
Figure 22:
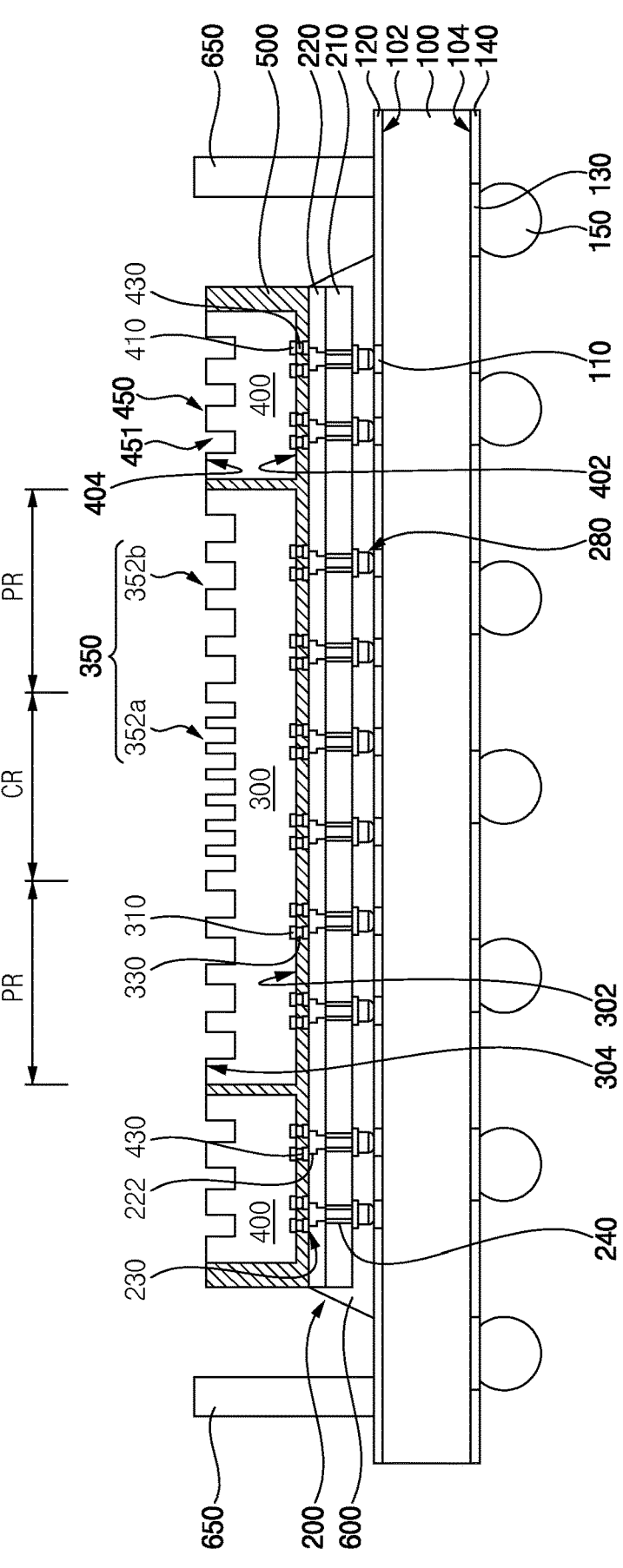

Referring to FIGS. 21 and 22, the interposer 200 on which the first and second semiconductor devices 300 and 400 are mounted may be disposed on a package substrate 100, and an underfill member 600 may be formed between the interposer 200 and the package substrate 100. External connection members 150 such as solder balls may be formed on the external connection pads 130 on a lower surface 104 of the package substrate 100. A reinforcing member 650 may be formed on the package substrate 100 to extend and surround the interposer 200 to complete the semiconductor package 10 of FIG. 1.

As illustrated in FIG. 21, the interposer 200 may be mounted on the package substrate 100 via the first conductive bumps 280. The interposer 200 may be adhered on the package substrate 100 by a thermal compression process.

The second bonding pad 264 of the interposer 200 may be electrically connected to a substrate pad 110 of the package substrate 100 by the first conductive bump 280.

Then, an underfill solution may be dispensed between the interposer 200 and the package substrate 100 while positioning a dispenser nozzle at a corner of the interposer 200 or moving along an edge of the interposer 200, and the underfill solution may be cured to form the underfill member 600. The underfill member 600 may reinforce a gap between the interposer 200 and the package substrate 100.

As illustrated in FIG. 22, then, the external connection members 150 such as solder balls may be formed on the external connection pads 130 of the package substrate 100, and the reinforcing member 650 may be formed on the package substrate 100 to extend and surround the interposer 200.

The reinforcing member 650 may include a stiffener. The reinforcing member 650 may be attached on an upper surface 102 of the package substrate 100 by an adhesive. The reinforcing member 650 may include a ring-shaped sidewall structure extending along a peripheral region of the interposer 200. Alternatively, the reinforcing member 650 may include four sidewall structures extending along the peripheral region of the interposer 200. For example, first, second, third and fourth sidewall structures may be disposed on the package structure 100 such as shown in FIG. 2 for example respectively adjacent to first side surface S1, second side surface S2, third side surface S3 and fourth side surface S4 of interposer 200. The sidewall structure may prevent warpage of the package substrate 100. A height of the reinforcing member 650 from the package substrate 100 may be greater than or equal to a height of the sealing member 500 from the package substrate 100.

Thus, a molded interposer may be mounted and packaged on the package substrate 100 and finally mounted on a main board to be provided as a chip-related component of an electronic device.

Figure 23:
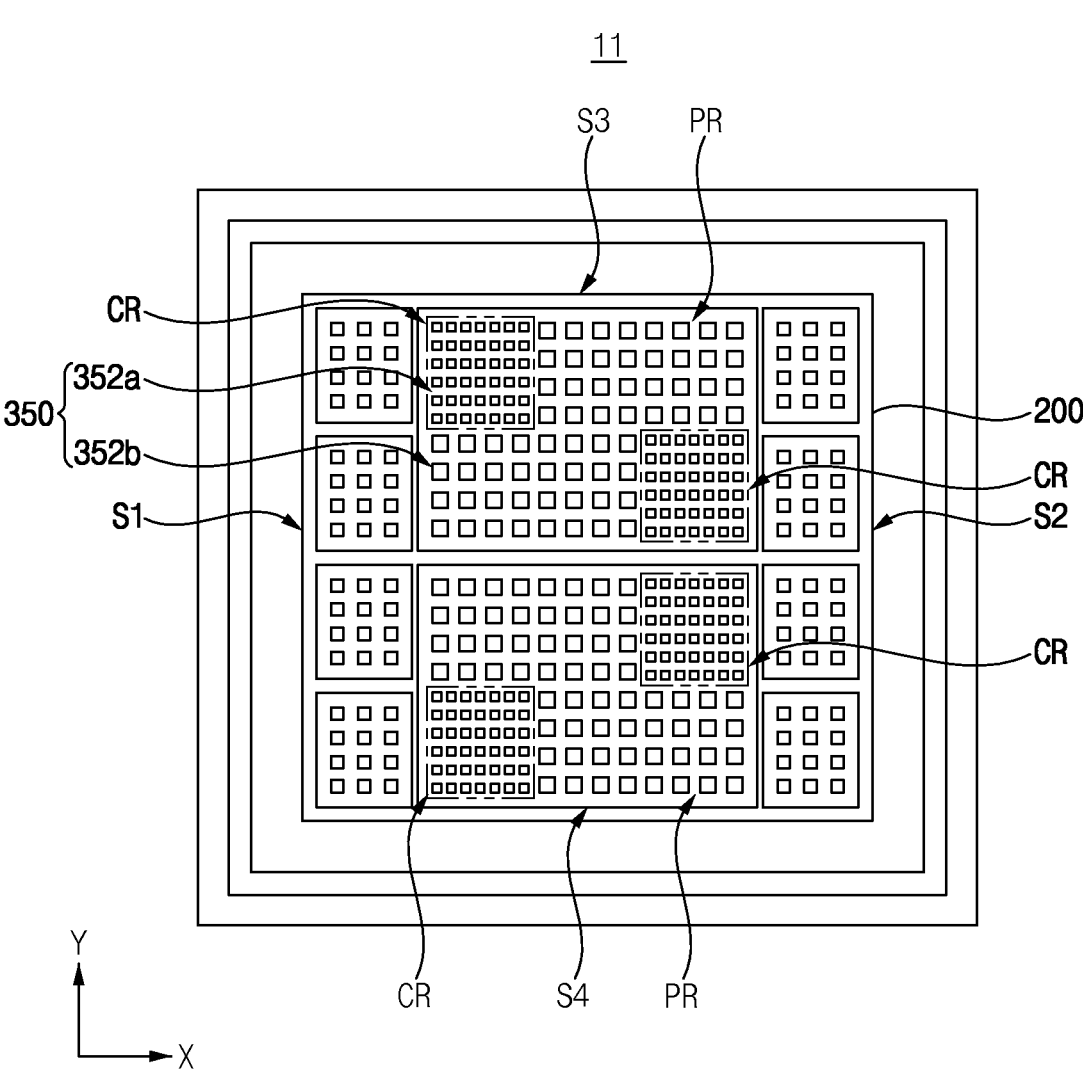
FIG. 23 illustrates a plan view of a semiconductor package in accordance with embodiments of the inventive concepts.

FIG. 23 illustrates a plan view of a semiconductor package in accordance with embodiments of the inventive concepts. The semiconductor package is substantially the same as the semiconductor package described with reference to FIGS. 1 and 2 except for a configuration of a first concavo-convex pattern. Thus, similar reference numerals will be used to refer to the same or like elements and any further repetitive explanation concerning the above elements will be omitted.

Referring to FIG. 23, a semiconductor package 11 may include a sealing member 500 (not shown in order to simplify the drawing figure) on an interposer 200 and covering first and second semiconductor devices 300 and 400 and exposing upper surfaces 304 and 404 of the first and second semiconductor devices 300 and 400, a first concavo-convex pattern 350 provided in the upper surface 304 of the first semiconductor device 300 exposed by the sealing member 500, and a second concavo-convex pattern 450 provided in the upper surface 404 of the second semiconductor device 400 exposed by the sealing member 500.

In example embodiments, the first semiconductor device 300 may include a plurality of first regions CR and a second region PR. The first region CR may be a hot spot region where a relatively large amount of heat is emitted. The first region CR may be a region having a relatively high first current density. The first regions CR may be defined in consideration of a thermal profile of the first semiconductor device 300.

The first concavo-convex pattern 350 may include a plurality of first pillar structures 352a respectively provided in the upper surfaces 304 of the first regions CR of the first semiconductor device 300. The plurality of first pillar structures 352a may provide a thermal silicon fin surface to effectively dissipate heat from the hot spot and maximize a heat transfer surface area.

Figure 24:
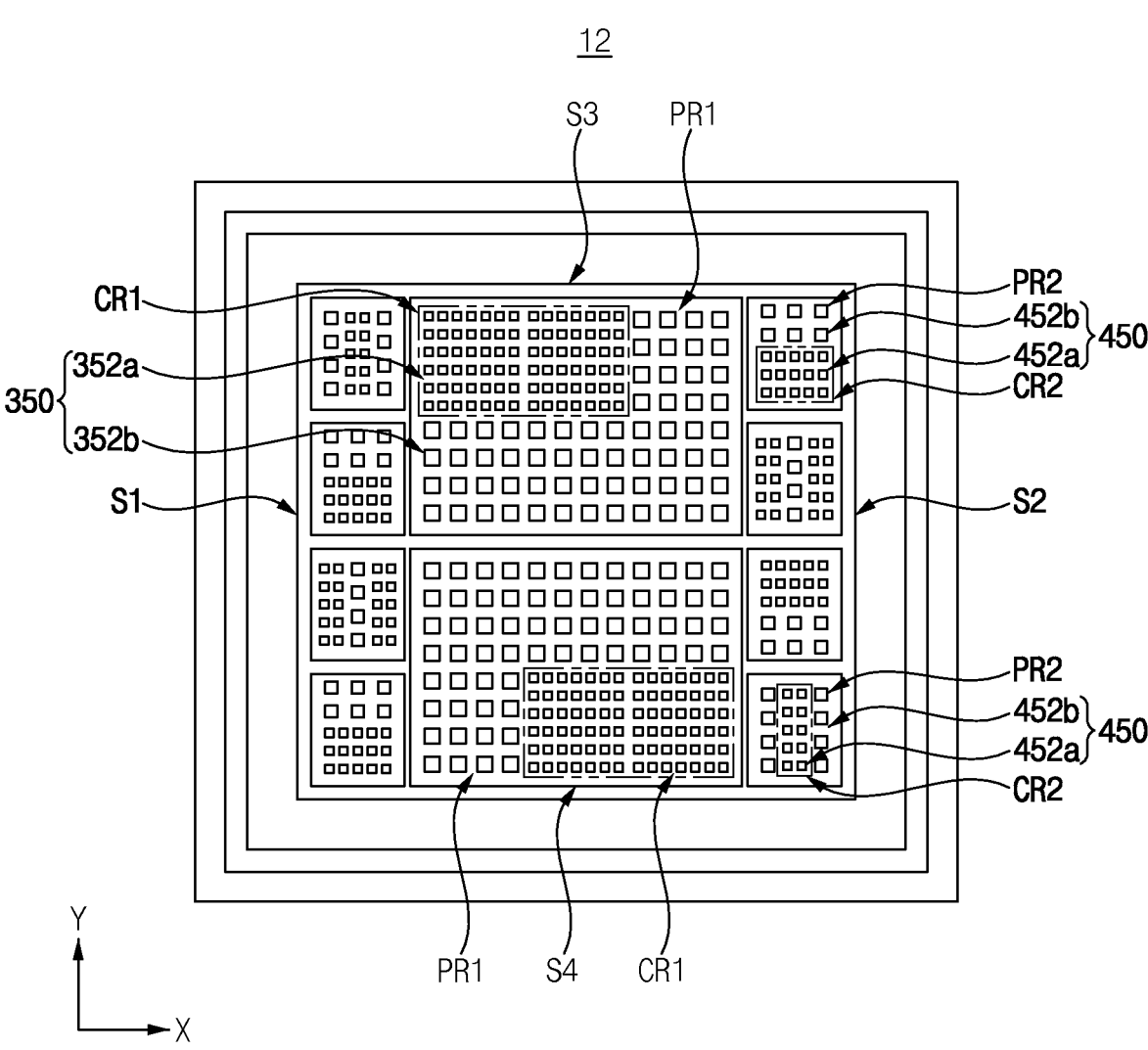
FIG. 24 illustrates a plan view of a semiconductor package in accordance with embodiments of the inventive concepts.

FIG. 24 illustrates a plan view of a semiconductor package in accordance with embodiments of the inventive concepts. The semiconductor package may be substantially the same as the semiconductor package described with reference to FIGS. 1 and 2 except for arrangements of first and second concavo-convex patterns. Thus, similar reference numerals will be used to refer to the same or like elements and any further repetitive explanation concerning the above elements will be omitted.

Referring to FIG. 24, a semiconductor package 12 may include a first concavo-convex pattern 350 provided in an upper surface 304 of a first semiconductor device 300 exposed by a sealing member 500 and a second concavo-convex pattern 450 provided in an upper surface 404 of a second semiconductor device 400 exposed by the sealing member 500.

In example embodiments, the first semiconductor device 300 may include a first region CR1 and a second region PR1, and each of the second semiconductor devices 400 may include a third region CR2 and a fourth region PR2. The first and third regions CR1 and CR2 may be hot spot regions where a relatively large amount of heat is dissipated, and the second and fourth regions PR1 and PR2 may be regions where a relatively low amount of heat is dissipated. The first and third regions CR1 and CR2 may be regions having a first current density, and the second and fourth regions PR1 and PR2 may be regions having a second current density lower than the first current density.

The first concave-convex pattern 350 may include a plurality of first pillar structures 352a provided in the upper surface 304 of the first region CR1 of the first semiconductor device 300 and a plurality of second pillar structures 352b provided in the upper surface 304 of the second region PR1 of the first semiconductor device 300. The second concavo-convex pattern 450 may include a plurality of third pillar structures 452a provided in the upper surface 404 of the third region CR2 of the second semiconductor device 400 and a plurality of fourth pillar structures 452b provided in the upper surface 404 of the fourth region PR2 of the second semiconductor device 400. As should be understood, in some embodiments the size and arrangement of the respective regions corresponding to hot spot regions of first and second semiconductor devices 300 and 400 may be different. The plurality of first and third pillar structures 352a and 452a may provide thermal silicon fin surfaces to effectively dissipate heat from the hot spots and maximize a heat transfer surface area.

Figure 25:
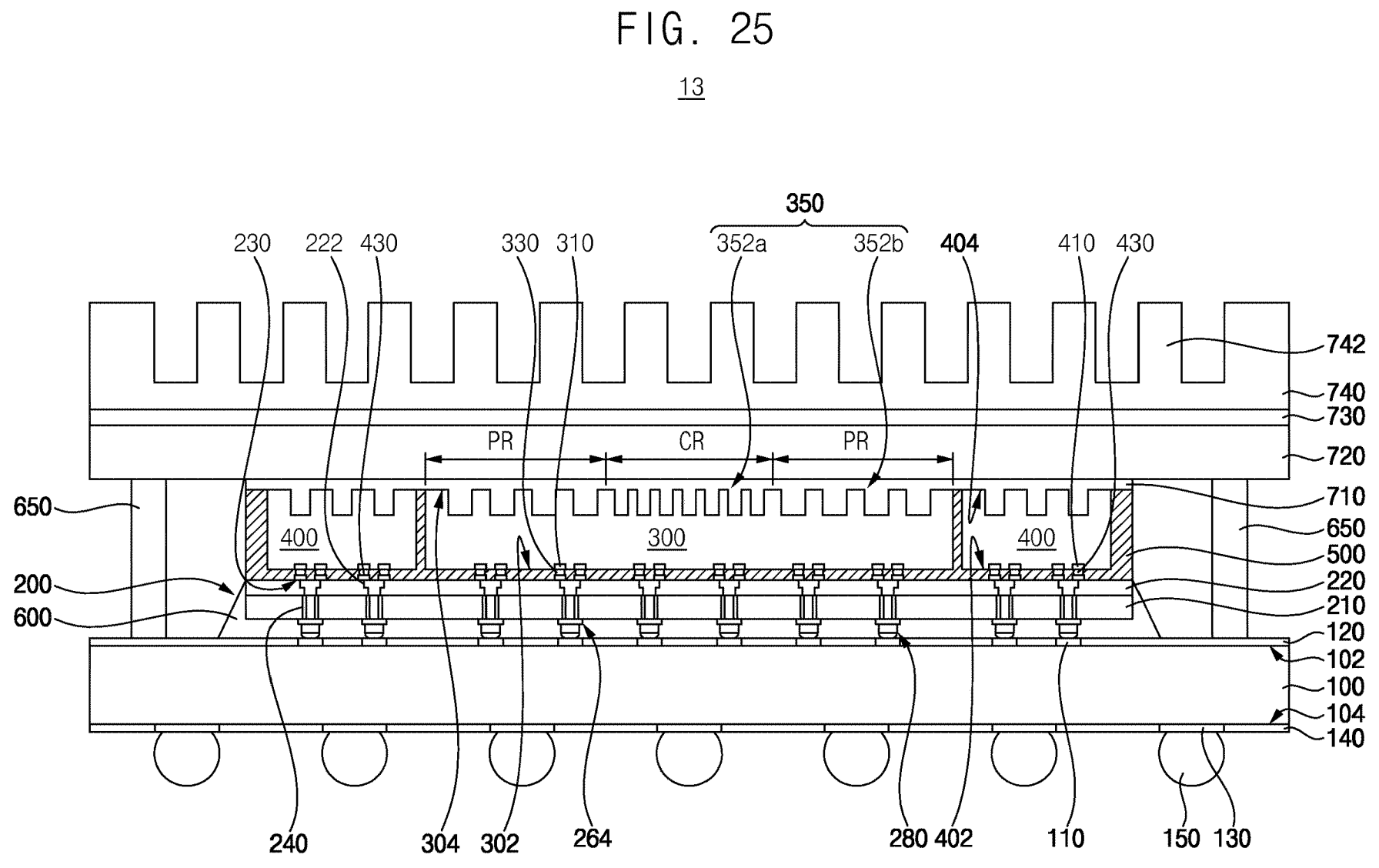

FIG. 25 illustrates a cross-sectional view of a semiconductor package in accordance with embodiments of the inventive concepts. The semiconductor package may be substantially the same as the semiconductor package described with reference to FIGS. 1 and 2 except for an additional configuration of a heat slug. Thus, similar reference numerals will be used to refer to the same or like elements and any further repetitive explanation concerning the above elements will be omitted.

Referring to FIG. 25, a semiconductor package 13 may include a package substrate 100, an interposer 200, first semiconductor devices 300, second semiconductor devices 400, a sealing member 500, first and second concavo-convex patterns 350 and 450, a reinforcing member 650 and a heat sink.

In example embodiments, the heat sink may be disposed on a molded interposer package. The molded interposer package may be substantially the same as or similar to the semiconductor package 10 of FIG. 1. Accordingly, the description of the molded interposer package will be omitted.

The heat sink may include a thermal interface material layer 710 provided on upper surfaces 304 and 404 of the first and second semiconductor devices 300 and 400 exposed by the sealing member 500 and a heat slug 740 provided on the thermal interface material layer 710.

In particular, a lid 720 may be disposed on the sealing member 500 with the thermal interface material layer 710 interposed therebetween. Additionally, the lid 720 may be supported on the reinforcing member 650. The heat slug 740 may be disposed on the lid 720 with a second thermal interface material layer 730 interposed therebetween. The heat slug 740 may have a plurality of heat dissipation fin structures 742.

In example embodiments, the thermal interface material layer 710 may be bonded to the upper surfaces 304 and 404 of the first and second semiconductor devices 300 and 400 exposed by the sealing member 500. The thermal interface material layer 710 may be provided to fill spaces between pillar structures of the first and second concavo-convex patterns. Accordingly, a surface area through which heat dissipates may be widened (i.e., increased) at the interface between the silicon of the first and second semiconductor devices 300 and 400 and the thermal interface material layer 710, to thereby greatly reduce thermal resistance.

Accordingly, heat from the first and second semiconductor devices 300 and 400 may be dissipated to the outside through the thermal interface material layer 710, the lid 720, the second thermal interface material layer 730 and the heat slug 740.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although example embodiments have been described, those skilled in the art will readily appreciate that many modifications are possible without materially departing from the novel teachings and advantages of the inventive concepts. Accordingly, all such modifications are intended to be included within the scope of example embodiments as defined in the claims.

What is claimed is:

1. A semiconductor package, comprising:
a package substrate;
an interposer mounted on the package substrate via first conductive bumps;
a first semiconductor device mounted on the interposer via second conductive bumps, the first semiconductor device including a first region and a second region;
at least one second semiconductor device spaced apart from the first semiconductor device on the interposer and mounted on the interposer via third conductive bumps;
a sealing member covering the first semiconductor device and the at least one second semiconductor device on the interposer and exposing upper surfaces of the first semiconductor device and the at least one second semiconductor device;
a plurality of first pillar structures provided in an upper surface of the first region of the first semiconductor device, the plurality of first pillar structures having a first width;
a plurality of second pillar structures provided in an upper surface of the second region of the first semiconductor device, the plurality of second pillar structures having a second width greater than the first width;
a plurality of third pillar structures provided in an upper surface of the at least one second semiconductor device;
a reinforcing member extending on the package substrate to surround the interposer;
a thermal interface material layer provided on the upper surfaces of the first semiconductor device and the at least one second semiconductor device; and
a heat slug provided on the reinforcing member and the thermal interface material layer.

2. The semiconductor package of claim 1, wherein a first spacing distance between adjacent first pillar structures from among the plurality of first pillar structures is smaller than a second separation distance between adjacent second pillar structures from among the plurality of second pillar structures.

3. The semiconductor package of claim 1, wherein the plurality of first pillar structures have a first height, and the plurality of second pillar structures have a second height equal to or smaller than the first height.

4. The semiconductor package of claim 3, wherein the first and second heights are within a range of 1 μm to 100 μm.

5. The semiconductor package of claim 1, wherein a ratio of a height of the plurality of first pillar structures to a spacing distance between adjacent first pillar structures from among the plurality of first pillar structures is within a range of 0.2 to 0.5.

6. The semiconductor package of claim 1, wherein the plurality of first pillar structures are defined by first trenches that are formed in the upper surface of the first region of the first semiconductor device and that cross each other, and
the plurality of second pillar structures are defined by second trenches that are formed in the upper surface of the second region of the first semiconductor device and that cross each other.

7. The semiconductor package of claim 1, wherein the plurality of third pillar structures have a third width greater than the first width.

8. The semiconductor package of claim 1, wherein the plurality of first, second and third pillar structures have a shape selected from a cylindrical shape, a quadrangular column shape, a cone shape, a quadrangular truncated pyramid shape, a hemispherical shape and a truncated cone shape.

9. The semiconductor package of claim 1, wherein the thermal interface material layer fills spaces between the plurality of first, second and third pillar structures.

10. The semiconductor package of claim 1, wherein some of the plurality of third pillar structures are provided in an upper surface of a third region of the second semiconductor device, and others of the plurality of third pillar structures are provided in an upper surface of a fourth region of the second semiconductor device.

11. A semiconductor package, comprising:
a package substrate;

an interposer mounted on the package substrate via first conductive bumps;

first and second semiconductor devices on the interposer and spaced apart from each other, and mounted on the interposer via second conductive bumps, the first and second semiconductor devices having concavo-convex patterns respectively formed in upper surfaces of the first and second semiconductor devices; and a sealing member on the interposer, covering the first and second semiconductor devices and exposing the concavo-convex patterns, wherein the concavo-convex patterns include a first concavo-convex pattern covering the first semiconductor device, the first concavo-convex pattern including a plurality of first pillar structures provided in an upper surface of a first region of the first semiconductor device, the first pillar structures having a first width, and a plurality of second pillar structures provided in an upper surface of a second region of the first semiconductor device, the second pillar structures having a second width greater than the first width.

12. The semiconductor package of claim 11, wherein a first spacing distance between adjacent first pillar structures from among the plurality of first pillar structures is smaller than a second spacing distance between adjacent second pillar structures from among the plurality of second pillar structures.

13. The semiconductor package of claim 11, wherein the plurality of first pillar structures have a first height, and the plurality of second pillar structures have a second height equal to or smaller than the first height.

14. The semiconductor package of claim 13, wherein the first and second heights are within a range of 1 μm to 100 μm.

15. The semiconductor package of claim 11, wherein a ratio of a height of each of the plurality of first pillar structures to a spacing distance between adjacent first pillar structures from among the plurality of first pillar structures is within a range of 0.2 to 0.5.

16. The semiconductor package of claim 11, wherein the plurality of first pillar structures are defined by first trenches that are formed in the upper surface of the first region of the first semiconductor device and that cross each other, and the plurality of second pillar structures are defined by second trenches that are formed in the upper surface of the second region of the first semiconductor device and that cross each other.

17. The semiconductor package of claim 11, wherein the plurality of first and second pillar structures have a shape selected from a cylinder shape, a quadrangular column shape, a cone shape, a quadrangular truncated pyramid shape, a hemispherical shape and a truncated cone shape.

18. The semiconductor package of claim 11, wherein the concavo-convex patterns include a second concavo-convex pattern covering the second semiconductor device, the second concavo-convex pattern including a plurality of third pillar structures provided in the upper surface of the second semiconductor device, the third pillar structures having a third width greater than the first width.

19. The semiconductor package of claim 11, further comprising a reinforcing member extending on the package substrate to surround the interposer.

20. A semiconductor package, comprising a package substrate;

an interposer mounted on the package substrate via first conductive bumps;

a first semiconductor device mounted on the interposer via second conductive bumps, the first semiconductor device including a first region and a second region;

at least one second semiconductor device spaced apart from the first semiconductor device on the interposer and mounted via third conductive bumps;

a sealing member on the interposer covering the first semiconductor device and the at least one second semiconductor device and exposing upper surfaces of the first semiconductor device and the at least one second semiconductor device;

a plurality of first pillar structures provided in an upper surface of the first region of the first semiconductor device, the first pillar structures having a first width and a first spacing distance therebetween;

a plurality of second pillar structures provided in an upper surface of the second region of the first semiconductor device, the second pillar structures having a second width greater than the first width and a second spacing distance therebetween greater than the first spacing distance; and a plurality of third pillar structures provided in the upper surface of the at least one second semiconductor device.

* * * * *